(12) United States Patent
Ramesh

(10) Patent No.: US 11,714,640 B2
(45) Date of Patent: Aug. 1, 2023

(54) BIT STRING OPERATIONS IN MEMORY

(71) Applicant: Micron Technology, Inc., Boise, ID (US)

(72) Inventor: Vijay S. Ramesh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/838,869

(22) Filed: Jun. 13, 2022

(65) Prior Publication Data

US 2022/0308874 A1 Sep. 29, 2022

Related U.S. Application Data

(62) Division of application No. 16/540,329, filed on Aug. 14, 2019, now Pat. No. 11,360,768.

(51) Int. Cl.
*G06F 9/30* (2018.01)
*G11C 7/08* (2006.01)
(Continued)

(52) U.S. Cl.
CPC ........ *G06F 9/30025* (2013.01); *G06F 3/0604* (2013.01); *G06F 3/0659* (2013.01);
(Continued)

(58) Field of Classification Search
CPC .. G06F 9/30025; G06F 3/0604; G06F 3/0659; G06F 3/0673; G06F 7/483;
(Continued)

(56) References Cited

U.S. PATENT DOCUMENTS

| | | |
|---|---|---|
| 4,380,046 A | 4/1983 | Fung |
| 4,435,792 A | 3/1984 | Bechtolsheim |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

(Continued)

*Primary Examiner* — Jung Kim
(74) *Attorney, Agent, or Firm* — Brooks, Cameron & Huebsch, PLLC

(57) ABSTRACT

Systems, apparatuses, and methods related to bit string operations in memory are described. The bit string operations may be performed within a memory array without transferring the bit strings or intermediate results of the operations to circuitry external to the memory array. For instance, sensing circuitry that can include a sense amplifier and a compute component can be coupled to a memory array. A controller can be coupled to the sensing circuitry and can be configured to cause one or more bit strings that are formatted according to a universal number format or a posit format to be transferred from the memory array to the sensing circuitry. The sensing circuitry can perform an arithmetic operation, a logical operation, or both using the one or more bit strings.

20 Claims, 11 Drawing Sheets

(51) Int. Cl.
  *G06F 3/06* (2006.01)
  *G11C 7/06* (2006.01)
  *G06F 7/483* (2006.01)
  *H03M 7/24* (2006.01)
  *G11C 11/4094* (2006.01)

(52) U.S. Cl.
  CPC ............ *G06F 3/0673* (2013.01); *G06F 7/483* (2013.01); *G06F 9/30014* (2013.01); *G11C 7/065* (2013.01); *G11C 7/08* (2013.01); *G11C 11/4094* (2013.01); *H03M 7/24* (2013.01)

(58) Field of Classification Search
  CPC ....... G06F 9/30014; G11C 7/065; G11C 7/08; G11C 11/4091; G11C 11/4094; G11C 11/4096; G11C 7/1006; H03M 7/24
  See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,758,972 A | 7/1988 | Frazier |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,507,877 B1 | 1/2003 | Ross |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,865,541 B1 | 1/2011 | Langhammer |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,214,417 B2 | 7/2012 | Ahmed |
| 8,223,568 B2 | 7/2012 | Seo |
| 8,238,173 B2 | 8/2012 | Akerib et al. |
| 8,274,841 B2 | 9/2012 | Shimano et al. |

(56) References Cited

U.S. PATENT DOCUMENTS

| | | |
|---|---|---|
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,659,605 B1 | 5/2017 | Zawodny et al. |
| 9,659,610 B1 | 5/2017 | Hush |
| 9,697,876 B1 | 7/2017 | Tiwari et al. |
| 9,761,300 B1 | 9/2017 | Willcock |
| 9,997,212 B1 | 6/2018 | Finkbeiner et al. |
| 10,068,664 B1 | 9/2018 | Penney et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247650 A1 | 9/2014 | Kobayashi et al. |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |

(56) References Cited

U.S. PATENT DOCUMENTS

| | | |
|---|---|---|
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0350230 A1 | 12/2016 | Murphy |
| 2016/0365129 A1 | 12/2016 | Willcock |
| 2016/0371033 A1 | 12/2016 | La Fratta et al. |
| 2017/0052906 A1 | 2/2017 | Lea |
| 2017/0178701 A1 | 6/2017 | Willcock et al. |
| 2017/0192844 A1 | 7/2017 | Lea et al. |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford et al. |
| 2017/0243623 A1 | 8/2017 | Kirsch et al. |
| 2017/0262369 A1 | 9/2017 | Murphy |
| 2017/0263306 A1 | 9/2017 | Murphy |
| 2017/0269865 A1 | 9/2017 | Willcock et al. |
| 2017/0269903 A1 | 9/2017 | Tiwari |
| 2017/0277433 A1* | 9/2017 | Willcock ............ G06F 9/30036 |
| 2017/0277440 A1 | 9/2017 | Willcock |
| 2017/0277581 A1 | 9/2017 | Lea et al. |
| 2017/0277637 A1 | 9/2017 | Willcock et al. |
| 2017/0278559 A1 | 9/2017 | Hush |
| 2017/0278584 A1 | 9/2017 | Rosti |
| 2017/0285988 A1 | 10/2017 | Dobelstein |
| 2017/0293434 A1 | 10/2017 | Tiwari |
| 2017/0301379 A1 | 10/2017 | Hush |
| 2017/0309314 A1 | 10/2017 | Zawodny et al. |
| 2017/0329577 A1 | 11/2017 | Tiwari |
| 2017/0336989 A1 | 11/2017 | Zawodny et al. |
| 2017/0337126 A1 | 11/2017 | Zawodny et al. |
| 2017/0337953 A1 | 11/2017 | Zawodny et al. |
| 2017/0352391 A1 | 12/2017 | Hush |
| 2017/0371539 A1 | 12/2017 | Mai et al. |
| 2018/0012636 A1 | 1/2018 | Alzheimer et al. |
| 2018/0024769 A1 | 1/2018 | Howe et al. |
| 2018/0024926 A1 | 1/2018 | Penney et al. |
| 2018/0025759 A1 | 1/2018 | Penney et al. |
| 2018/0025768 A1 | 1/2018 | Hush |
| 2018/0032458 A1 | 2/2018 | Bell |
| 2018/0033478 A1 | 2/2018 | Lea et al. |
| 2018/0039484 A1 | 2/2018 | La Fratta et al. |
| 2018/0046405 A1 | 2/2018 | Hush et al. |
| 2018/0046461 A1 | 2/2018 | Tiwari |
| 2018/0060069 A1 | 3/2018 | Rosti et al. |
| 2018/0074754 A1 | 3/2018 | Crawford |
| 2018/0075899 A1 | 3/2018 | Hush |
| 2018/0082747 A1 | 3/2018 | Tamura |
| 2018/0088850 A1 | 3/2018 | Willcock |
| 2018/0102147 A1 | 4/2018 | Willcock et al. |
| 2018/0108397 A1 | 4/2018 | Venkata et al. |
| 2018/0130515 A1 | 5/2018 | Zawodny et al. |
| 2018/0136871 A1 | 5/2018 | Leidel |
| 2018/0239531 A1 | 8/2018 | Lea |
| 2018/0239712 A1 | 8/2018 | Lea |
| 2018/0240510 A1 | 8/2018 | Hush et al. |
| 2019/0138440 A1 | 5/2019 | Lee |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1999 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

Gustafson, et al. "Beating Floating Point at its Own Game: Posit Arithmetic", Jan. 2017, (16 pgs), retrieved from <http://www.johngustafson.net/pdfs/BeatingFloatingPoint.pdf>.

International Search Report and Written Opinion from related PCT Application No. PCT/US2020/043668, dated Oct. 26, 2020, 14 pages.

Jaiswal, et al., "Universal Number Posit Arithmetic Generator on FPGA", 2018 Design, Automation & Test in Europe Conference & Exhibition Apr. 23, 2018, 4 pages.

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

(56) References Cited

OTHER PUBLICATIONS

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

\* cited by examiner

| | | 844 | 845 | 856 | 870 | 871 |
|---|---|---|---|---|---|---|
| | | A | B | NOT OPEN | OPEN TRUE | OPEN INVERT |
| | | 0 | 0 | 0 | 0 | 1 |
| | | 0 | 1 | 0 | 1 | 0 |
| | | 1 | 0 | 1 | 0 | 1 |
| | | 1 | 1 | 1 | 1 | 0 |

875 →

| | FF | 0 | 0 | 0 | 0 | 0 | 0 | 1 | 1 | 1 | ← 876 |
| | FT | 0 | 0 | 0 | 1 | 1 | 1 | 0 | 0 | 0 | ← 877 |
| | TF | 0 | 0 | 1 | 0 | 0 | 1 | 0 | 0 | 1 | ← 878 |
| | TT | 0 | 1 | 0 | 0 | 1 | 0 | 0 | 1 | 0 | ← 879 |
| A | B | A | A*B | A*$\bar{B}$ | A+B | B | AXB | A+$\bar{B}$ | $\overline{AXB}$ | $\bar{B}$ | ← 847 |
| 0 | 0 | 0 | 0 | 0 | 0 | 0 | 0 | 1 | 1 | 1 |
| 0 | 1 | 0 | 0 | 0 | 1 | 1 | 1 | 0 | 0 | 0 |
| 1 | 0 | 1 | 0 | 1 | 1 | 0 | 1 | 1 | 0 | 1 |
| 1 | 1 | 1 | 1 | 0 | 1 | 1 | 0 | 1 | 1 | 0 |

880 brackets rows 876–879

*FIG. 8*

BIT STRING OPERATIONS IN MEMORY

PRIORITY INFORMATION

This application is a Divisional of U.S. application Ser. No. 16/540,329, filed Aug. 14, 2019, which issued as U.S. Pat. No. 11,360,768 on Jun. 14, 2022, the contents of which are included herein by reference.

TECHNICAL FIELD

The present disclosure relates generally to semiconductor memory and methods, and more particularly, to apparatuses, systems, and methods for bit string operations in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

BRIEF DESCRIPTION OF THE DRAWINGS

FIG. 8 is a logic table illustrating selectable logic operation results implemented by a sensing circuitry in accordance with a number of embodiments of the present disclosure.

DETAILED DESCRIPTION

Figure 1A:
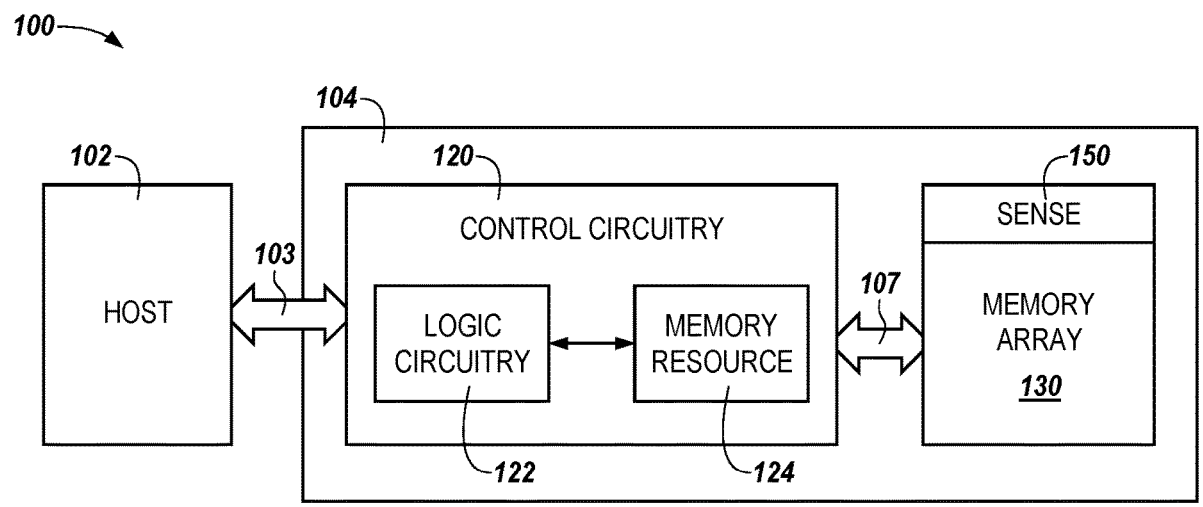
FIG. 1A is a functional block diagram in the form of an apparatus including a host and a memory device in accordance with a number of embodiments of the present disclosure.

Systems, apparatuses, and methods related to bit string operations in memory are described. The bit string operations may be performed within a memory array without transferring the bit strings or intermediate results of the operations to circuitry external to the memory array. For instance, sensing circuitry that can include a sense amplifier and a compute component can be coupled to a memory array. A controller can be coupled to the sensing circuitry and can be configured to cause one or more bit strings that are formatted according to a universal number format or a posit format to be transferred from the memory array to the sensing circuitry. The sensing circuitry can perform an arithmetic operation, a logical operation, or both using the one or more bit strings.

Computing systems may perform a wide range of operations that can include various calculations, which can require differing degrees of accuracy. However, computing systems have a finite amount of memory in which to store operands on which calculations are to be performed. In order to facilitate performance of operation on operands stored by a computing system within the constraints imposed by finite memory resources, operands can be stored in particular formats. One such format is referred to as the "floating-point" format, or "float," for simplicity (e.g., the IEEE 754 floating-point format).

Under the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., +∞ and −∞) and/or two kinds of "NaN" (not-a-number): a quiet NaN and a signaling NaN, may be included in a bit string.

The floating-point standard has been used in computing systems for a number of years and defines arithmetic formats, interchange formats, rounding rules, operations, and exception handling for computation carried out by many computing systems. Arithmetic formats can include binary and/or decimal floating-point data, which can include finite numbers, infinities, and/or special NaN values. Interchange formats can include encodings (e.g., bit strings) that may be used to exchange floating-point data. Rounding rules can include a set of properties that may be satisfied when rounding numbers during arithmetic operations and/or conversion operations. Floating-point operations can include arithmetic operations and/or other computational operations such as trigonometric functions. Exception handling can include indications of exceptional conditions, such as division by zero, overflows, etc.

An alternative format to floating-point is referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the mantissa to indicate whether a real number is an exact float, or if it lies in the interval between adjacent floats. The sign, exponent, and mantissa bits in a Type I unum take their definition from the IEEE 754 floating-point format, however, the length of the exponent and mantissa fields of Type I unums can vary dramatically, from a single bit to a maximum user-definable length. By taking the sign, exponent, and mantissa bits from the IEEE 754 standard floating-point format, Type I unums can behave similar to floating-point numbers, however, the variable bit length exhibited in the exponent and fraction bits of the Type I unum can require additional management in comparison to floats.

Type II unums are generally incompatible with floats, however, Type II unums can permit a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. As a result, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." In contrast to floating-point bit strings, posits can, under certain conditions, allow for higher precision (e.g., a broader dynamic range, higher resolution, and/or higher accuracy) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations thereby reducing processing time and/or power consumed in performing such operations. In addition, the use of posits in computing systems can allow for higher accuracy and/or precision in computations than floating-point numbers, which can further improve the functioning of a computing system in comparison to some approaches (e.g., approaches which rely upon floating-point format bit strings).

Posits can be highly variable in precision and accuracy based on the total quantity of bits and/or the quantity of sets of integers or sets of bits included in the posit. In addition, posits can generate a wide dynamic range. The accuracy, precision, and/or the dynamic range of a posit can be greater than that of a float, or other numerical formats, under certain conditions, as described in more detail herein. The variable accuracy, precision, and/or dynamic range of a posit can be manipulated, for example, based on an application in which a posit will be used. In addition, posits can reduce or eliminate the overflow, underflow, NaN, and/or other corner cases that are associated with floats and other numerical formats. Further, the use of posits can allow for a numerical value (e.g., a number) to be represented using fewer bits in comparison to floats or other numerical formats.

These features can, in some embodiments, allow for posits to be highly reconfigurable, which can provide improved application performance in comparison to approaches that rely on floats or other numerical formats. In addition, these features of posits can provide improved performance in machine learning applications in comparison to floats or other numerical formats. For example, posits can be used in machine learning applications, in which computational performance is paramount, to train a network (e.g., a neural network) with a same or greater accuracy and/or precision than floats or other numerical formats using fewer bits than floats or other numerical formats. In addition, inference operations in machine learning contexts can be achieved using posits with fewer bits (e.g., a smaller bit width) than floats or other numerical formats. By using fewer bits to achieve a same or enhanced outcome in comparison to floats or other numerical formats, the use of posits can therefore reduce an amount of time in performing operations and/or reduce the amount of memory space required in applications, which can improve the overall function of a computing system in which posits are employed.

Embodiments herein are directed to hardware circuitry (e.g., control circuitry) configured to perform various operations on bit strings to improve the overall functioning of a computing device. For example, embodiments herein are directed to hardware circuitry that is configured to perform conversion operations to convert a format of a bit string from a first format (e.g., a floating-point format) that supports arithmetic or logical operations to a first level of precision to a second format (e.g., a universal number format, a posit format, etc.) that supports arithmetic or logical operations to a second level of precision.

In some embodiments, the hardware circuitry can be configured to perform the conversion operations on the bit strings such that the resultant bit strings (e.g., the bit strings having the second format) each have a same bit string shape. As used herein, a "bit string shape" generally refers to a number of bits and a number of bits in each bit sub-set, which are described in more detail in connection with FIGS. 3, 4A, and 4B, herein, associated with the bit strings. For example, a bit string having eight total bits with zero exponent bits (e.g., an <8,0> bit string) has a same bit shape as another <8,0> bit string. Similarly, a bit string having 16 total bits with one sign bit, five regime bits, seven mantissa bits, and three exponent bits can have a same bit shape as another bit string that includes one sign bit, five regime bits, seven mantissa bits, and three exponent bits.

Once the conversion operation(s) have been performed, the hardware circuitry may be configured to transfer the converted bit strings to a non-persistent memory device, such as a dynamic random-access memory (DRAM) device.

The converted bit strings can be manipulated within a memory array of the non-persistent memory device as part of performance one or more arithmetic, bitwise, vector, and/or logical operations using the converted bit strings as operands.

For example, sensing circuitry deployed in a DRAM device can be configured to perform one or more arithmetic, bitwise, vector, and/or logical operations using the converted bit strings as operands. As described in more detail herein, the sensing circuitry can include sense amplifiers and compute components that, when operated according to various control signals, can perform such operations on the converted bit strings. In some embodiments, the operations can be performed within the sensing circuitry and/or the memory array without activating (e.g., prior to activating) input/output circuitry coupled to the memory array and/or the sensing circuitry. Accordingly, in some embodiments, the sensing circuitry can be configured to perform the operations using the converted bit strings in without transferring the bit strings out of the memory array and/or the sensing circuitry until the requested operation is completed.

By performing such operations within the memory array of the non-persistent memory device using bit strings that have been covered to the second format, improved performance of the computing system may be realized by allowing for improved accuracy and/or precision in the performed operations, improved speed in performing the operations, and/or a reduced required storage space for bit strings prior to, during, or subsequent to, performance of arithmetic and/or logical operations.

In some embodiments, results (e.g., resultant bit strings) of the operations performed within the memory array can be transferred back to the hardware circuitry and the hardware circuitry can be further operated to convert the results of the operations back to the first format (e.g., to a floating-point format), which can, in turn, be transferred to different circuitry (e.g., a host, a memory device, etc.) of the computing system.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N" "M," "X," and "Y," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "bit strings," "data," and "data values" are used interchangeably herein and can have the same meaning, as appropriate to the context. In addition, the terms "set of bits," "bit sub-set," and "portion" (in the context of a portion of bits of a bit string) are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 120 may reference element "20" in FIG. 1, and a similar element may be referenced as 220 in FIG. 2. A group or plurality of similar elements or components may generally be referred to herein with a single element number. For example, a plurality of reference elements 433-1, 433-2, . . . , 433-N may be referred to generally as 433. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a functional block diagram in the form of a computing system 100 including an apparatus including a host 102 and a memory device 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. The memory device 104 can include a one or more memory modules (e.g., single in-line memory modules, dual in-line memory modules, etc.). The memory device 104 can include volatile memory and/or non-volatile memory. In a number of embodiments, memory device 104 can include a multi-chip device. A multi-chip device can include a number of different memory types and/or memory modules. For example, a memory system can include non-volatile or volatile memory on any type of a module. As shown in FIG. 1, the apparatus 100 can include control circuitry 120, which can include logic circuitry 122 and a memory resource 124, a memory array 130, and sensing circuitry 150 (e.g., the SENSE 150). In addition, each of the components (e.g., the host 102, the control circuitry 120, the logic circuitry 122, the memory resource 124, the memory array 130, and/or the sensing circuitry 150) can be separately referred to herein as an "apparatus." The control circuitry 120 may be referred to as a "processing device" or "processing unit" herein.

The memory device 104 can provide main memory for the computing system 100 or could be used as additional memory or storage throughout the computing system 100. The memory device 104 can include one or more memory arrays 130 (e.g., arrays of memory cells), which can include volatile and/or non-volatile memory cells. The memory array 130 can be a flash array with a NAND architecture, for example. Embodiments are not limited to a particular type of memory device. For instance, the memory device 104 can include RAM, ROM, DRAM, SDRAM, PCRAM, RRAM, and flash memory, among others.

In embodiments in which the memory device 104 includes non-volatile memory, the memory device 104 can include flash memory devices such as NAND or NOR flash memory devices. Embodiments are not so limited, however, and the memory device 104 can include other non-volatile memory devices such as non-volatile random-access memory devices (e.g., NVRAM, ReRAM, FeRAM, MRAM, PCM), "emerging" memory devices such as resistance variable (e.g., 3-D Crosspoint (3D XP)) memory devices, memory devices that include an array of self-selecting memory (SSM) cells, etc., or combinations thereof. Resistance variable memory devices can perform bit storage based on a change of bulk resistance, in conjunction with a stackable cross-gridded data access array. Additionally, in contrast to many flash-based memories, resistance variable non-volatile memory can perform a write in-place operation, where a non-volatile memory cell can be programmed without the non-volatile memory cell being previously erased. In contrast to flash-based memories and resistance variable memories, self-selecting memory cells can include memory cells that have a single chalcogenide material that serves as both the switch and storage element for the memory cell.

As illustrated in FIG. 1, a host 102 can be coupled to the memory device 104. In a number of embodiments, the memory device 104 can be coupled to the host 102 via one or more channels (e.g., channel 103). In FIG. 1, the memory device 104 is coupled to the host 102 via channel 103 and acceleration circuitry 120 of the memory device 104 is coupled to the memory array 130 via a channel 107. The host 102 can be a host system such as a personal laptop computer, a desktop computer, a digital camera, a smart phone, a memory card reader, and/or an internet-of-things (IoT) enabled device, among various other types of hosts.

The host 102 can include a system motherboard and/or backplane and can include a memory access device, e.g., a processor (or processing device). One of ordinary skill in the art will appreciate that "a processor" can intend one or more processors, such as a parallel processing system, a number of coprocessors, etc. The system 100 can include separate integrated circuits or both the host 102, the memory device 104, and the memory array 130 can be on the same integrated circuit. The system 100 can be, for instance, a server system and/or a high-performance computing (HPC) system and/or a portion thereof. Although the example shown in FIG. 1 illustrate a system having a Von Neumann architecture, embodiments of the present disclosure can be implemented in non-Von Neumann architectures, which may not include one or more components (e.g., CPU, ALU, etc.) often associated with a Von Neumann architecture.

The memory device 104, which is shown in more detail in FIG. 2, herein, can include acceleration circuitry 120, which can include logic circuitry 122 and a memory resource 124. The logic circuitry 122 can be provided in the form of an integrated circuit, such as an application-specific integrated circuit (ASIC), field programmable gate array (FPGA), reduced instruction set computing device (RISC), advanced RISC machine, system-on-a-chip, or other combination of hardware and/or circuitry that is configured to perform operations described in more detail, herein. In some embodiments, the logic circuitry 122 can comprise one or more processors (e.g., processing device(s), processing unit(s), etc.)

The logic circuitry 122 can perform operations on bit strings stored by the memory resource 124 to convert the bit strings between various formats and/or cause the converted bit strings to be transferred to the memory array 130. For example, the conversion operations can include operations to convert floating-point bit strings (e.g., floating-point numbers) to bit strings in a posit format, and vice versa. Once the floating-point bit strings are converted to bit strings in the posit format, the logic circuitry 122 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or recursive logical operations such as AND, OR, XOR, NOT, etc., as well as trigonometric operations such as sine, cosine, tangent, etc. using the posit bit strings. As will be appreciated, the foregoing list of operations is not intended to be exhaustive, nor is the foregoing list of operations intended to be limiting, and the logic circuitry 122 may be configured to perform (or cause performance of) other arithmetic and/or logical operations.

The control circuitry 120 can further include a memory resource 124, which can be communicatively coupled to the logic circuitry 122. The memory resource 124 can include volatile memory resource, non-volatile memory resources, or a combination of volatile and non-volatile memory resources. In some embodiments, the memory resource can be a random-access memory (RAM) such as static random-access memory (SRAM). Embodiments are not so limited, however, and the memory resource can be a cache, one or more registers, NVRAM, ReRAM, FeRAM, MRAM, PCM), "emerging" memory devices such as resistance variable memory resources, phase change memory devices, memory devices that include arrays of self-selecting memory cells, etc., or combinations thereof.

The memory resource 124 can store one or more bit strings. Subsequent to performance of the conversion operation by the logic circuitry 122, the bit string(s) stored by the memory resource 124 can be stored according to a universal number (unum) or posit format. As used herein, the bit string stored in the unum (e.g., a Type III unum) or posit format can include several sub-sets of bits or "bit sub-sets." For example, a universal number or posit bit string can include a bit sub-set referred to as a "sign" or "sign portion," a bit sub-set referred to as a "regime" or "regime portion," a bit sub-set referred to as an "exponent" or "exponent portion," and a bit sub-set referred to as a "mantissa" or "mantissa portion" (or significand). As used herein, a bit sub-set is intended to refer to a sub-set of bits included in a bit string. Examples of the sign, regime, exponent, and mantissa sets of bits are described in more detail in connection with FIGS. 3 and 4A-4B, herein. Embodiments are not so limited, however, and the memory resource can store bit strings in other formats, such as the floating-point format, or other suitable formats.

In some embodiments, the memory resource 124 can receive data comprising a bit string having a first format that provides a first level of precision (e.g., a floating-point bit string). The logic circuitry 122 can receive the data from the memory resource and convert the bit string to a second format that provides a second level of precision that is different from the first level of precision (e.g., a universal number or posit format). The first level of precision can, in some embodiments, be lower than the second level of precision. For example, if the first format is a floating-point format and the second format is a universal number or posit format, the floating-point bit string may provide a lower level of precision under certain conditions than the universal number or posit bit string, as described in more detail in connection with FIGS. 3 and 4A-4B, herein.

The first format can be a floating-point format (e.g., an IEEE 754 format) and the second format can be a universal number (unum) format (e.g., a Type I unum format, a Type II unum format, a Type III unum format, a posit format, a valid format, etc.). As a result, the first format can include a mantissa, a base, and an exponent portion, and the second format can include a mantissa, a sign, a regime, and an exponent portion.

The logic circuitry 122 can be configured to transfer bit strings that are stored in the second format to the memory array 130, which can be configured to cause performance of an arithmetic operation or a logical operation, or both, using the bit string having the second format (e.g., a unum or posit format). In some embodiments, the arithmetic operation and/or the logical operation can be a recursive operation. As used herein, a "recursive operation" generally refers to an operation that is performed a specified quantity of times where a result of a previous iteration of the recursive operation is used an operand for a subsequent iteration of the operation. For example, a recursive multiplication operation can be an operation in which two bit string operands, β and φ are multiplied together and the result of each iteration of the recursive operation is used as a bit string operand for a subsequent iteration. Stated alternatively, a recursive operation can refer to an operation in which a first iteration of the recursive operation includes multiplying β and φ together to arrive at a result λ (e.g., β×φ=λ). The next iteration of this example recursive operation can include multiplying the result λ by φ to arrive at another result ω (e.g., λ×φ=ω).

Another illustrative example of a recursive operation can be explained in terms of calculating the factorial of a natural number. This example, which is given by Equation 1 can include performing recursive operations when the factorial of a given number, n, is greater than zero and returning unity if the number n is equal to zero:

$$fact(n) = \begin{cases} 1 & \text{if } n = 0 \\ n \times fact(n-1) & \text{if } n > 0 \end{cases} \quad \text{Equation 1}$$

As shown in Equation 1, a recursive operation to determine the factorial of the number n can be carried out until n is equal to zero, at which point the solution is reached and the recursive operation is terminated. For example, using Equation 1, the factorial of the number n can be calculated recursively by performing the following operations: n×(n−1)×(n−2)× . . . ×1.

Yet another example of a recursive operation is a multiply-accumulate operation in which an accumulator, a is modified at iteration according to the equation a ←a+(b×c). In a multiply-accumulate operation, each previous iteration of the accumulator a is summed with the multiplicative product of two operands b and c. In some approaches, multiply-accumulate operations may be performed with one or more roundings (e.g., a may be truncated at one or more iterations of the operation). However, in contrast, embodiments herein can allow for a multiply-accumulate operation to be performed without rounding the result of intermediate iterations of the operation, thereby preserving the accuracy of each iteration until the final result of the multiply-accumulate operation is completed.

Examples of recursive operations contemplated herein are not limited to these examples. To the contrary, the above examples of recursive operations are merely illustrative and are provided to clarify the scope of the term "recursive operation" in the context of the disclosure.

Figure 1B:
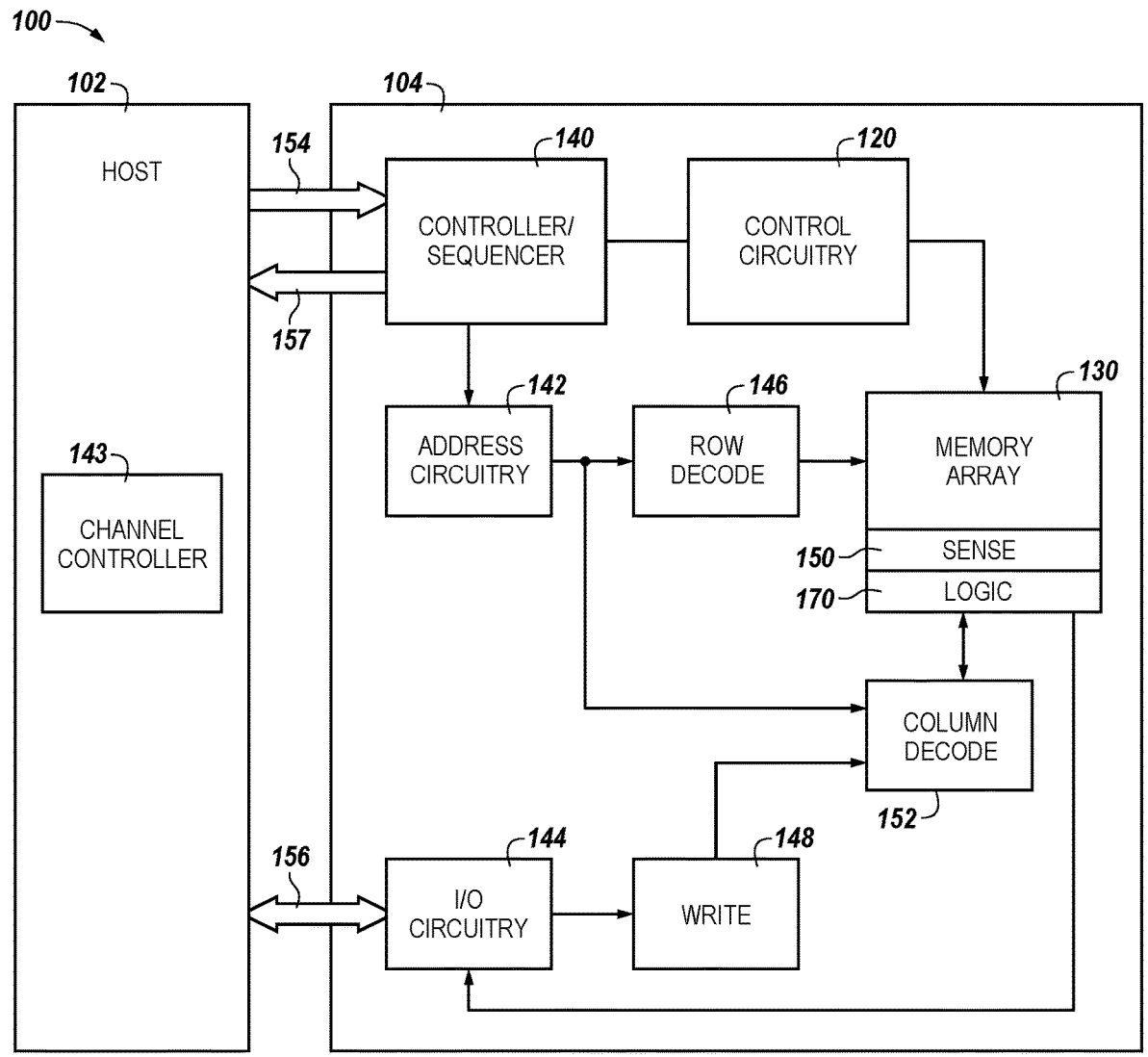
FIG. 1B is a block diagram of an apparatus in the form of an electronic system including a memory device in accordance with a number of embodiments of the present disclosure.

As shown in FIG. 1, sensing circuitry 150 is coupled to a memory array 130 and the control circuitry 120. The sensing circuitry 150 can include one or more sense amplifiers and one or more compute components, which are described in more detail in connection with FIG. 6, herein. The sensing circuitry 150 can provide additional storage space for the memory array 130 and can sense (e.g., read, store, cache) data values that are present in the memory device 104. In some embodiments, the sensing circuitry 150 can be located in a periphery area of the memory device 104. For example, the sensing circuitry 150 can be located in an area of the memory device 104 that is physically distinct from the memory array 130. The sensing circuitry 150 can include sense amplifiers, latches, flip-flops, etc. that can be configured to stored data values, as described herein. In some embodiments, the sensing circuitry 150 can be provided in the form of a register or series of registers and can include a same quantity of storage locations (e.g., sense amplifiers, latches, etc.) as there are rows or columns of the memory array 130. For example, if the memory array 130 contains around 16K rows or columns, the sensing circuitry 150 can include around 16K storage locations. Accordingly, in some embodiments, the sensing circuitry 150 can be a register that is configured to hold up to 16K data values, although embodiments are not so limited as described in more detail in connection with FIGS. 1B, 2A, and 6, herein.

The embodiment of FIG. 1 can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory device 104 and/or the memory array 130. It will be appreciated by those skilled in the art that the number of address input connections can depend on the density and architecture of the memory device 104 and/or the memory array 130.

FIG. 1B is a block diagram of an apparatus in the form of an electronic system 100 including a memory device 120 in accordance with a number of embodiments of the present disclosure. As used herein, a memory device 120, memory controller 140, channel controller 143, memory array 130, sensing circuitry 150, including sensing components, and peripheral logic 170 might each also be separately considered an "apparatus."

In this example, the system 100 includes a host 102 coupled (e.g., connected) to memory device 120, which includes the memory array 130. The host 102 can be a host system such as a personal laptop computer, a desktop computer, a tablet computer, a digital camera, a smart phone, an internet-of-things (IoT) enabled device, or a memory card reader, among various other types of hosts. The host 102 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and a high-performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and NOR flash array, for instance. The memory array 130 can include memory cells arranged in rows coupled by access lines (which may be referred to herein as word lines or select lines) and columns coupled by sense lines (which may be referred to herein as data lines or digit lines). Although a single memory array 130 is shown in FIG. 1, embodiments are not so limited. For instance, memory device 120 may include a number of memory arrays 130 (e.g., a number of banks of DRAM cells, NAND flash cells, etc.).

The memory device 120 includes address circuitry 142 to latch address signals provided over an address/control bus 154 (e.g., an address/control bus from the host 102). Address signals are received by address circuitry 142 and decoded by row decode circuitry 146 and column decode circuitry 152 to access the memory array 130. Although the address/control bus 154 is shown as a single bus, the bus 154 can comprise separate address and control busses. The column decode circuitry 152 can comprise logic (e.g., multiplexor circuitry) to selectively couple shared I/O lines to subsets of sensing components in association with reversing data stored in memory in accordance with embodiments described herein. The shared I/O (SIO) lines can provide an increased data path size (e.g., width) as compared to previous data paths used to move data from the array 130 to DQ pads, for instance, among other benefits. For instance, in a number of embodiments, the SIO lines may serve as both local I/O lines and global I/O lines corresponding to array 130, which can facilitate moving data between subarrays (e.g., portions of a memory array being coupled to separate sensing circuitry stripes).

Data can be sensed (read) from memory array 130 by sensing voltage and/or current changes on digit lines using a number of sensing components (e.g., sense amplifiers) of the sensing circuitry 150. A sense amplifier can read and latch a page (e.g., a row) of data from the memory array 130. As described further herein, the sensing components of the sensing circuitry 150 can comprise respective sense amplifiers and corresponding compute components coupled thereto that can be used to sense, store (e.g., cache and/or buffer), and move data, for instance. The I/O circuitry 144 can be used for bi-directional data communication with host 102 over the data bus 156 (e.g., DQ connections). The write circuitry 148 can be used to write data to the memory array 130.

The memory controller 140, which can serve as a sequencer, can decode control signals (e.g., commands) provided by address/control bus 154 from the host 102. These signals can include chip enable signals, write enable signals, and address latch signals that can be used to control operations performed on the memory array 130, including data sense, data store, data move, data write, and data erase operations, among other operations. The memory controller 140 can be responsible for executing instructions from the host 102 and/or accessing the memory array 130. The memory controller 140 can be a state machine, a sequencer, or some other type of controller and can be implemented in hardware, software, firmware, and/or combinations thereof. In the example shown in FIG. 1, system 100 includes a bus 157 which can provide, for example, status and exception information from the memory controller 140 to a channel controller 143.

Examples of the sensing circuitry 150 are described further below (e.g., in FIG. 6). For instance, in a number of embodiments, the sensing circuitry 150 can include a number of sense amplifiers and corresponding compute components, which may serve as an accumulator and can be used to perform arithmetic and/or logical operations on universal number or posit bit strings received from the control circuitry 120. The sensing circuitry 150 can be used to reverse data stored in memory (e.g., in array 130) in accordance with embodiments described herein.

In a number of embodiments, the sensing circuitry 150 can also be used to perform logical operations (e.g., logical functions such as AND, OR, NOT, NOR, NAND, XOR, etc.) using data stored in memory array 130 as inputs and participate in movement of the data for writing and storage operations back to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 102 and other processing circuitry, such as ALU circuitry, located on device 120, such as on memory controller 140 or elsewhere).

In various previous approaches, data associated with an operand, for instance, would be read from memory via sensing circuitry and provided to external ALU circuitry via I/O lines (e.g., via local I/O lines and global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling a local I/O line and global I/O line coupled to the sensing circuitry 150. The sensing circuitry 150 can be formed on pitch with the memory cells of the array. Additional peripheral logic 170, which can include an additional number of sense amplifiers, can be coupled to the sensing circuitry 150. The sensing circuitry 150 and the peripheral logic 170 can cooperate in performing logical operations and/or in reversing data stored in memory, according to a number of embodiments described herein.

As such, in a number of embodiments, circuitry external to memory array 130 and sensing circuitry 150 is not needed to reverse data stored in memory array 130 and/or to perform compute functions as the sensing circuitry 150 can perform the appropriate operations in order to perform such data reversal and/or compute functions without the use of an external processing resource. Therefore, the sensing circuitry 150 may be used to complement and to replace, at least to some extent, such an external processing resource (or at least the bandwidth consumption of such an external processing resource).

Figure 2A:
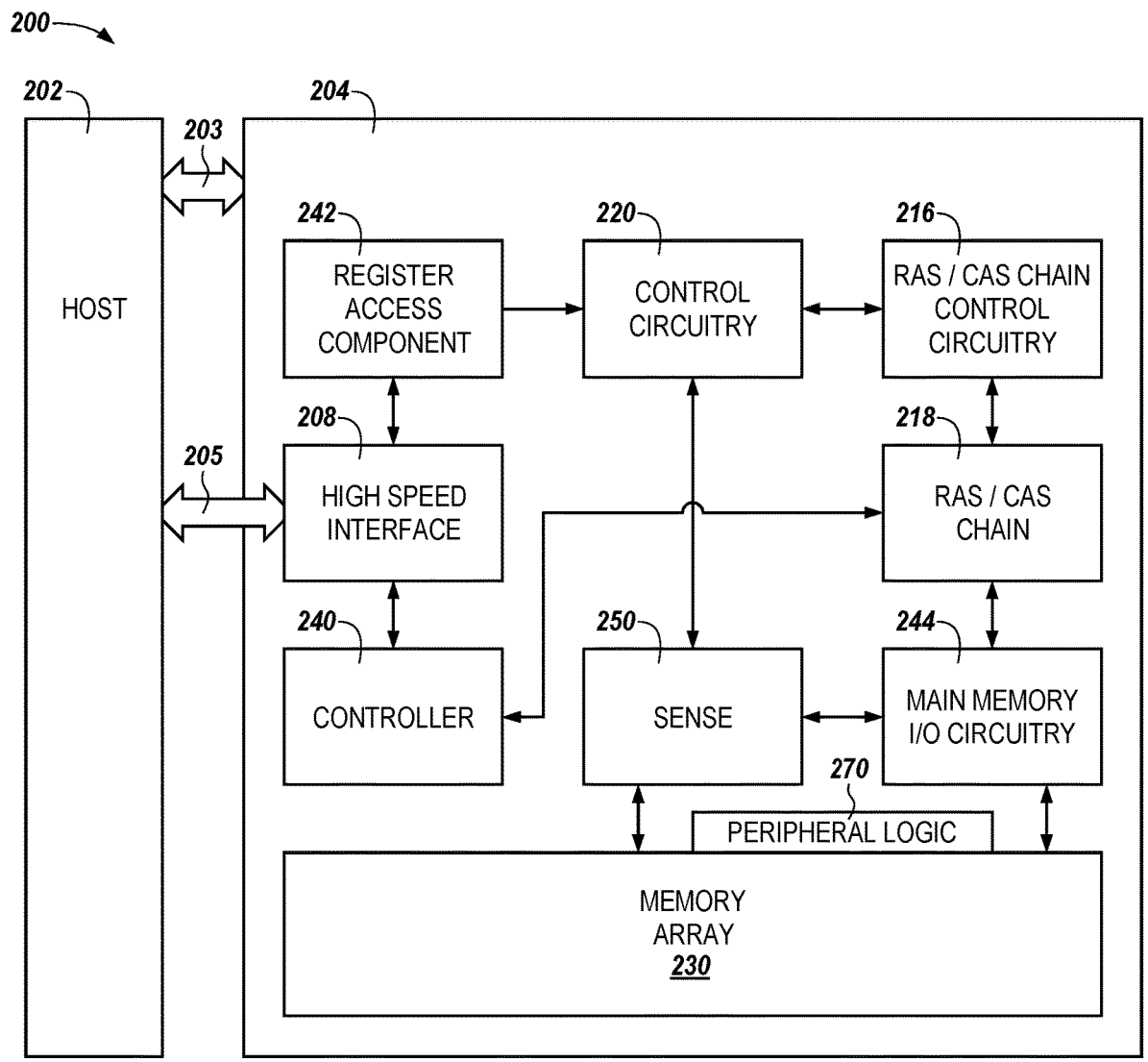
FIG. 2A is a functional block diagram in the form of a computing system including an apparatus including a host and a memory device in accordance with a number of embodiments of the present disclosure.

FIG. 2A is a functional block diagram in the form of a computing system including an apparatus 200 including a host 202 and a memory device 204 in accordance with a number of embodiments of the present disclosure. The memory device 204 can include control circuitry 220, which can be analogous to the control circuitry 120 illustrated in FIGS. 1A and 1B. Similarly, the host 202 can be analogous to the host 102 illustrated in FIGS. 1A and 1B, and the memory device 204 can be analogous to the memory device 104 illustrated in FIGS. 1A and 1B. Each of the components (e.g., the host 202, the control circuitry 220, the sensing circuitry 250, and/or the memory array 230, etc.) can be separately referred to herein as an "apparatus."

The host 202 can be communicatively coupled to the memory device 204 via one or more channels 203, 205. The channels 203, 205 can be interfaces or other physical connections that allow for data and/or commands to be transferred between the host 202 and the memory device 205. For example, commands to cause initiation of an operation (e.g., an operation to convert one or more bit strings from a first format to a second format (or vice versa), an operation to cause the bit strings to be loaded into the sensing circuitry 250 to perform an arithmetic and/or logical operation, etc.) to be performed using the control circuitry 220 can be transferred from the host via the channels 203, 205. It is noted that, in some embodiments, the control circuitry 220 can perform the operations in response to an initiation command transferred from the host 202 via one or more of the channels 203, 205 in the absence of an intervening command from the host 202. That is, once the control circuitry 220 has received the command to initiate performance of an operation from the host 202, the operations can be performed by the control circuitry 220 in the absence of additional commands from the host 202.

As shown in FIG. 2A, the memory device 204 can include a register access component 242, a high speed interface (HSI) 208, a controller 240, sensing circuitry 250, main memory input/output (I/O) circuitry 244, row address strobe (RAS)/column address strobe (CAS) chain control circuitry 216, a RAS/CAS chain component 218, control circuitry 220, and a memory array 230. The sensing circuitry 250 and/or the control circuitry 220 are, as shown in FIG. 2, located in an area of the memory device 204 that is physically distinct from the memory array 230. That is, in some embodiments, the sensing circuitry 250 and/or the control circuitry 220 are located in a periphery location of the memory array 230.

The register access component 242 can facilitate transferring and fetching of data from the host 202 to the memory device 204 and from the memory device 204 to the host 202. For example, the register access component 242 can store addresses (or facilitate lookup of addresses), such as memory addresses, that correspond to data that is to be transferred to the host 202 from the memory device 204 or transferred from the host 202 to the memory device 204. In some embodiments, the register access component 242 can facilitate transferring and fetching data that is to be operated upon by the control circuitry 220 and/or the register access component 242 can facilitate transferring and fetching data that is has been operated upon by the control circuitry 220, or in response to an action taken by the control circuitry 220, for transfer to the host 202.

The HSI 208 can provide an interface between the host 202 and the memory device 204 for commands and/or data traversing the channel 205. The HSI 208 can be a double data rate (DDR) interface such as a DDR3, DDR4, DDR5, etc. interface. Embodiments are not limited to a DDR interface, however, and the HSI 208 can be a quad data rate (QDR) interface, peripheral component interconnect (PCI) interface (e.g., a peripheral component interconnect express (PCIe)) interface, or other suitable interface for transferring commands and/or data between the host 202 and the memory device 204.

The controller 240 can be responsible for executing instructions from the host 202 and accessing the control circuitry 220 and/or the memory array 230. The controller 240 can be a state machine, a sequencer, or some other type of controller. The controller 240 can receive commands from the host 202 (via the HSI 208, for example) and, based on the received commands, control operation of the control circuitry 220 and/or the memory array 230. In some embodiments, the controller 240 can receive a command from the host 202 to cause performance of an operation using the control circuitry 220. Responsive to receipt of such a command, the controller 240 can instruct the control circuitry 220 to begin performance of the operation(s).

In a non-limiting example, the controller 240 can instruct the control circuitry 220 to perform an operation to retrieve one or more bit strings from the host 202 and/or the memory array 230. For example, the controller 240 can receive a command from the host 202 requesting performance of an operation between one or more bit strings and send a command to the control circuitry 220 to perform the operation. The control circuitry 220 can perform an operation to convert the bit strings from a first format to second and/or cause the bit strings that are stored in the second format to be transferred to, and stored within, the memory array 230. In some embodiments, the control circuitry 220 can determine that the converted bit strings have a same bit string shape. If the converted bit strings do not have a same bit string shape, the control circuitry 220 can perform one or more operations on the converted bit strings to ensure that the converted bit strings have a same bit string shape prior to causing the converted bit strings to be stored in the memory array 230.

For example, the control circuitry 220 can, based on commands received from the controller, manipulate a quantity of bits associated with one or more bit sub-sets of the converted bit strings such that the converted bit strings have a same bit string shape. In some embodiments, manipulating the quantity of bits within the bit sub-sets of the converted bit strings can include removing one or more bits from particular bit sub-sets of at least one of the one or more converted bit strings to ensure that the converted bit strings have a same bit string shape.

Subsequent to the control circuitry 220 ensuring that the converted bit strings have the same bit string shape, the control circuitry 220 can cause the bit strings to be transferred to the memory array 230 and/or the sensing circuitry 250. Once the bit strings have been received by the memory array 230 and/or sensing circuitry 250, the sensing circuitry 250 can perform arithmetic and/or logical operations using the converted bit strings.

In some embodiments, the controller 240 can be a global processing controller and may provide power management functions to the memory device 204. Power management functions can include control over power consumed by the memory device 204 and/or the memory array 230. For example, the controller 240 can control power provided to various banks of the memory array 230 to control which banks of the memory array 230 are operational at different times during operation of the memory device 204. This can include shutting certain banks of the memory array 230 down while providing power to other banks of the memory array 230 to optimize power consumption of the memory device 230. In some embodiments, the controller 240 controlling power consumption of the memory device 204 can include controlling power to various cores of the memory device 204 and/or to the control circuitry 220, the memory array 230, etc.

As mentioned above, the sensing circuitry 250 can provide additional storage space for the memory array 230 and can sense (e.g., read, store, cache) data values that are present in the memory device 204. The sensing circuitry 250 can include sense amplifiers, latches, flip-flops, etc. that can be configured to perform operations (e.g., arithmetic and/or logical operations) using the bit strings, as described herein.

As shown in FIG. 2A, the sensing circuitry 250 is in a location of the memory device 204 that is physically distinct from the memory array 230. In some embodiments, the sensing circuitry 250 can be provided in the form of a register or series of registers and can include a same quantity of sense amplifiers and/or compute components as there are rows or columns of the memory array 230. For example, if the memory array 230 contains around 16K rows or columns, the sensing circuitry 250 can include around 16K storage locations. Accordingly, in some embodiments, the sensing component 250 can be a register that is configured to hold up to around 16K data values.

However, embodiments are not limited to scenarios in which the sensing circuitry 250 includes around 16K location in which to store data values. For example, the sensing component 250 can be configured to store around 2K data values, around 4K data values, around 8K data values, etc. Further, although a single box is shown as illustrating the sensing component 250 in FIG. 2A, in some embodiments there can be more that a single "row" of sensing components 250. For example, there may be two, four, or eight, among other quantities, of "rows" of sensing components 250 that can each be configured to store around 2K data values, around 4K data values, around 8K data values, around 16K data values, etc.

As described in more detail in connection with FIGS. 6, 7A-7B, and 8, the sensing circuitry 250 can be configured to facilitate performance of arithmetic and/or logical operations between bit strings (e.g., bit string in the universal number format or the posit format) that are stored in the memory array 230. For example, once the bit strings have been converted to the second format (e.g., the universal number format or the posit format) by the control circuitry 220 and stored in the memory array 230, the sensing circuitry 250 can perform the operations described in FIGS. 7A-7B using the converted bit strings to perform arithmetic and/or logical operations using the converted bit strings.

If the arithmetic and/or logical operations performed using the sensing circuitry 250 are recursive operations, in some embodiments, the periphery logic 270 can be configured to store intermediate results of recursive operations performed using bit strings. In some embodiments, the intermediate results of the recursive operations can represent a result generated at each iteration of the recursive operation. In contrast to some approaches, because the periphery logic 270 can be configured to store up to 16K data values, the intermediate results of the recursive operations may not to be rounded (e.g. truncated) during performance of the recursive operation.

Instead, in some embodiments, a final result of the recursive operation that is stored in the periphery logic 270 upon completion of the recursive operation may be rounded to a desired bit width (e.g., 8-bits, 16-bits, 32-bits, 64-bits, etc.). This can improve the accuracy of the result of the recursive operation, because, in contrast to approaches that do not utilize the periphery logic 270 to store the intermediate results of the recursive operation, intermediate results of the recursive may not need to be rounded before the final result of the recursive operation is computed.

The periphery logic 270 can be configured to overwrite previously stored intermediate results of the recursive operation when a new iteration of the recursive operation is completed. For example, a result that represents the first iteration of a recursive operation can be stored in the periphery logic 270 once the first iteration of the recursive operation is complete. Once a result that represents a second iteration of the recursive operation is completed, the result of the second iteration of the recursive operation can be stored in the periphery logic 270. Similarly, once a result that represents a third iteration of the recursive operation is completed, the result of the third iteration of the recursive operation can be stored in the periphery logic 270. In some embodiments, the result of each subsequent iteration can be stored in the periphery logic 270 by overwriting the stored result of the previous iteration.

Depending on the bit string shape (e.g., the bit width) of the result of each iteration, subsequent bit strings that represent the result of each iteration and are stored in the periphery logic 270 may be stored using more sense amplifiers in the periphery logic 270 than preceding stored bit strings. For example, the result of the first iteration may contain a first quantity of bits and the result of the second iteration may contain a second quantity of bits that is greater than the first quantity of bits. When the result of the second iteration is written to or stored by the periphery logic 270, it may be stored such that the result of the first iteration is overwritten, however, because the result of the second iteration may contain more bits that the result of the first iteration, in some embodiments, additional sense amplifiers of the periphery logic 270 may be used to store the result of the second iteration in addition to the sense amplifiers that were used to store the result of the first iteration.

In a simplified, non-limiting example in which the recursive operation comprises a recursive multiplication operation in which a number 2.51 is recursively multiplied with a number 3.73, the result of the first iteration may be 9.3623. In this example, the result of the first iteration includes five bits and can be stored, for example, in five sense amplifiers in the periphery logic 270. The result of the second iteration (e.g., the result of multiplication between the first result 9.3623 and 3.73) can be 34.921379, which includes eight bits. In some embodiments, the result of the second iteration can be stored in eight sense amplifiers of the periphery logic 270 by, for example, overwriting the result of the first iteration that are stored in five sense amplifiers and writing the additional three bits to three other sense amplifiers in the periphery logic 270. The results of subsequent iterations of the recursive operation can similarly be stored in the sensing component 250 such that the result of the preceding iteration is overwritten. Embodiments are not so limited, however, and in some embodiments, the results of each iteration can be stored in adjacent sense amplifiers in the sensing component 250, or in particular sense amplifiers of the periphery logic 270.

In some embodiments, access to the periphery logic 270 can be controlled using a register mapping. For example, bit strings can be stored in the periphery logic 270, deleted from the periphery logic 270, and/or the bit width of bit strings stored in the periphery logic 270 can be altered in response to commands associated with a registry mapping that can be stored in the control circuitry 220. In addition, bit strings stored in the memory array 230 can be added to or subtracted from (e.g., accumulated with) bit strings stored in the periphery logic 270 in response to commands associated with the control circuitry 220.

The control circuitry 220 can also include commands associated with converting results of operations performed as part of a recursive operation using universal number or posit bit strings between the universal number or posit format and formats that can be stored in the sensing component 250, the periphery logic 270, and/or the memory array 230, as described in more detail in connection with FIG. 6, herein. For example, the control circuitry 220 can include one or more registers that can include commands associated with causing a posit bit string to be represented in terms of a sign bit, mantissa bits, exponent bits, and a k-value, which can be used to expand a bit string such that it is represented in the posit format.

The main memory input/output (I/O) circuitry 244 can facilitate transfer of data and/or commands to and from the memory array 230. For example, the main memory I/O circuitry 244 can facilitate transfer of bit strings, data, and/or commands from the host 202 and/or the control circuitry 220 to and from the memory array 230. In some embodiments, the main memory I/O circuitry 214 can include one or more direct memory access (DMA) components that can transfer the bit strings (e.g., posit bit strings stored as blocks of data) from the control circuitry 220 to the memory array 230, and vice versa.

In some embodiments, the main memory I/O circuitry 244 can facilitate transfer of bit strings, data, and/or commands from the memory array 230 to the control circuitry 220 so that the control circuitry 220 can perform operations on the bit strings. Similarly, the main memory I/O circuitry 244 can facilitate transfer of bit strings that have had one or more operations performed on them by the control circuitry 220 to the memory array 230. As described in more detail herein, the operations can include recursive operations performed using bit string (e.g., universal number bit strings or posit bit strings) in which results of intermediate iterations are stored in the periphery logic 270.

As described above, posit bit strings (e.g., the data) can be stored and/or retrieved from the memory array 230. In some embodiments, the main memory I/O circuitry 244 can facilitate storing and/or retrieval of the posit bit strings to and/or from the memory array 230. For example, the main memory I/O circuitry 244 can be enabled to transfer posit bit strings to the memory array 230 to be stored, and/or the main memory I/O circuitry 244 can facilitate retrieval of the posit bit strings (e.g., posit bit strings representing a performed operation between one or more posit bit string operands) from the memory array 230 in response to, for example, a command from the controller 210 and/or the control circuitry 220.

The row address strobe (RAS)/column address strobe (CAS) chain control circuitry 216 and the RAS/CAS chain component 218 can be used in conjunction with the memory array 230 to latch a row address and/or a column address to initiate a memory cycle. In some embodiments, the RAS/CAS chain control circuitry 216 and/or the RAS/CAS chain component 218 can resolve row and/or column addresses of the memory array 230 at which read and write operations associated with the memory array 230 are to be initiated or terminated. For example, upon completion of an operation using the control circuitry 220, the RAS/CAS chain control circuitry 216 and/or the RAS/CAS chain component 218 can latch and/or resolve a specific location in the periphery sense amplifiers 211 and/or the memory array 230 to which the bit strings that have been operated upon by the control circuitry 220 are to be stored. Similarly, the RAS/CAS chain control circuitry 216 and/or the RAS/CAS chain component 218 can latch and/or resolve a specific location in the periphery sense amplifiers 211 and/or the memory array 230 from which bit strings are to be transferred to the control circuitry 220 prior to, or subsequent to, the control circuitry 220 performing an operation (e.g., a recursive operation) on the bit string(s).

The control circuitry 220 can include logic circuitry (e.g., the logic circuitry 122 illustrated in FIG. 1) and/or memory resource(s) (e.g., the memory resource 124 illustrated in FIG. 1). Bit strings (e.g., data, a plurality of bits, etc.) can be received by the control circuitry 220 from, for example, the host 202, the memory array 230, and/or an external memory device and stored by the control circuitry 220, for example in the memory resource of the control circuitry 220. The control circuitry (e.g., the logic circuitry 222 of the control circuitry 220) can perform operations (or cause operations to be performed) on the bit string(s) and cause intermediate results of the operations to be stored in the memory array 230 for subsequent processing. As described above, in some embodiments, the bit string(s) can be formatted in a unum or posit format.

As described in more detail in connection with FIGS. 3 and 4A-4B, universal numbers and posits can provide improved accuracy and may require less storage space (e.g., may contain a smaller number of bits) than corresponding bit strings represented in the floating-point format. For example, a numerical value represented by a floating-point number can be represented by a posit with a smaller bit width than that of the corresponding floating-point number. Accordingly, by performing operations (e.g., arithmetic operations, logical operations, bit-wise operations, vector operations, etc.) using posit bit strings, performance of the memory device 204 may be improved in comparison to approaches that utilize only floating-point bit strings because subsequent operations (e.g., arithmetic and/or logical operations) may be performed more quickly on the posit bit strings (e.g., because the data in the posit format is smaller and therefore requires less time to perform operations on). Further, performance of the memory device 204 may be improved in comparison to approaches that utilize only floating-point bit strings because less memory space is required in the memory device 202 to store the bit strings in the posit format, which can free up additional space in the memory device 202 for other bit strings, data, and/or other operations to be performed.

In some embodiments, once the bit strings have been converted to the universal number or posit format by the control circuitry 220 and stored in the memory array 230, the memory array 230 can, in conjunction with the sensing circuitry 250, perform (or cause performance of) arithmetic and/or logical operations on the universal number or posit bit strings. For example, the sensing circuitry 250, which is further described below in connection with FIG. 6, can be configured to perform (or cause performance of) arithmetic operations such as additions, subtractions, multiplications, divisions, fused multiply addition operations, multiply-accumulate operations, dot product operations, greater than or less than, absolute value (e.g., FABS( )), fast Fourier transforms, inverse fast Fourier transforms, sigmoid function operations, convolution operations, square root operations, exponent operations, and/or logarithm operations, and/or logical operations such as AND, OR, XOR, NOT, etc., as well as trigonometric operations such as sine, cosine, tangent, etc. As will be appreciated, the foregoing list of operations is not intended to be exhaustive, nor is the foregoing list of operations intended to be limiting, and the control circuitry 220 may be configured to perform (or cause performance of) other arithmetic and/or logical operations using universal number or posit bit strings.

In some embodiments, the sensing circuitry 250 may perform the above-listed operations in conjunction with execution of one or more machine learning algorithms. For example, the sensing circuitry 250 may perform operations related to one or more neural networks. Neural networks may allow for an algorithm to be trained over time to determine an output response based on input signals. For example, over time, a neural network may essentially learn to better maximize the chance of completing a particular goal. This may be advantageous in machine learning applications because the neural network may be trained over time with new data to achieve better maximization of the chance of completing the particular goal. A neural network may be trained over time to improve operation of particular tasks and/or particular goals. However, in some approaches, machine learning (e.g., neural network training) may be processing intensive (e.g., may consume large amounts of computer processing resources) and/or may be time intensive (e.g., may require lengthy calculations that consume multiple cycles to be performed).

In contrast, by performing such operations using the sensing circuitry 250, for example, by performing such operations on bit strings in the universal number or posit format, the amount of processing resources and/or the amount of time consumed in performing the operations may be reduced in comparison to approaches in which such operations are performed using bit strings in a floating-point format. Further, by storing intermediate results of the recursive operations in the periphery logic 270, the accuracy of a bit string that represents the final result of the recursive operation may be higher in comparison to approaches that truncate intermediate results of recursive operations or in approaches in which intermediate results of recursive operations are stored in a hidden scratch area.

In some embodiments, the controller 210 can be configured to cause the control circuitry 220 and/or the sensing circuitry 250 to perform operations using bit strings without encumbering the host 202 (e.g., without receiving an intervening command or a command separate from a command to initiate performance of the operation from the host 202 and/or without transferring results of the operations to the host 202). Embodiments are not so limited, however, and in some embodiments, the controller 210 can be configured to cause the control circuitry 220 (e.g., the logic circuitry) and/or the sensing circuitry 250 to perform recursive arithmetic and/or recursive logical operations using bit strings, store intermediate results of such operations in the sensing circuitry 250 and/or round the final result of the recursive operation (which may be stored in the sensing circuitry 250 such that the final result of the recursive operation has a particular bit string shape associated therewith.

In some embodiments, the performance of the recursive operation can include performing an arithmetic operation, a logical operation, a bit-wise operation, a vector operation, or combinations thereof. In response to a determination that the recursive operation is completed, the control circuitry 220 can be configured to cause a last resultant bit string stored in the periphery logic 270 to be rounded (e.g., truncated) such that the last resultant bit string has a particular bit width. For example, the control circuitry 220 can cause the last resultant bit string stored in the periphery logic 270 to be rounded off to have a bit width of 8-bits, 16-bits, 32-bits, 64-bits, etc. In some embodiments, the control circuitry 220 can be configured to cause at least one bit from a mantissa bit sub-set or an exponent bit sub-set (which are described in more detail in connection with FIGS. 3, 4A, and 4B, herein) of the last resultant bit string to be deleted to truncate the last resultant bit string to the particular bit width.

As described above in connection with FIG. 1, the memory array 230 can be a DRAM array, SRAM array, STT RAM array, PCRAM array, TRAM array, RRAM array, NAND flash array, and/or NOR flash array, for instance, although embodiments are not limited to these particular examples. The memory array 230 can function as main memory for the computing system 200 shown in FIGS. 2A and 2B. In some embodiments, the memory array 230 can be configured to perform arithmetic and/or logical operations using bit string stored therein, store results of the arithmetic and/or logical operations, and/or store bit strings to be transferred to the control circuitry 220 prior to performance of conversion operations using the bit strings.

In some embodiments, bit strings (e.g., posit bit strings) can be generated and/or stored in the memory array 230 without encumbering the host 202. For example, the bit strings can be generated and/or stored in the memory array 230 without receiving multiple commands from the host 202. Stated alternatively, in some embodiments, the host 202 can send a single command to the memory device to request performance of an operation using one or more bit strings. Responsive to receipt of the command to request performance of the operation, the memory device 204 (e.g., the controller 210, the control circuitry 220, or other components of the memory device 204) can perform the operation and/or retrieve a stored result of the operation in the absence of additional commands from the host 202. This can reduce traffic across the channels 203/205, which can increase performance of a computing device associated with the host 202 and/or the memory device 204.

In a non-limiting example, the sensing circuitry 250 can include a sense amplifier (e.g., the sense amplifier 654 illustrated in FIG. 6) and a compute component (e.g., the compute component 665 illustrated in FIG. 6) and may be coupled to the memory array 230. The controller 240 can be configured to cause one or more bit strings that are formatted according to a universal number format or a posit format to be transferred from the memory array 230 to the sensing circuitry 250. As described above, the one or more bit strings each having a same bit string shape. The controller 240 can be further configured to cause the sensing circuitry 250 to perform an arithmetic operation, a logical operation, or both using the one or more bit strings.

In some embodiments, the sensing circuitry 250 can be configured to perform the arithmetic operation, the logical operation, or both by performing a first operation phase of the arithmetic operation, the logical operation, or both by sensing a memory cell of the array 230 that contains a first bit of the one or more bit strings, performing a number of intermediate operation phases of the arithmetic operation, the logical operation, or both by sensing a respective number of different memory cells that contain different bits of the one or more bit strings, and accumulating a result of the of the first operation phase and the number of intermediate operation phases in the compute component of the sensing circuitry 250. The sensing circuitry 250 can be configured to accumulate the result of the of the first operation phase and the number of intermediate operation phases in the compute component of the sensing circuitry 250 without performing a sense line address access. For example, the sensing circuitry 250 can be configured to accumulate the result of the of the first operation phase and the number of intermediate operation phases in the compute component of the sensing circuitry 250 prior to receiving an access command and/or an address for a sense line associated with the sensing circuitry 250.

In some embodiments, the sensing circuitry 250 can be further configured to store a result of the arithmetic operation, the logical operation, or both in the memory array without enabling an input/output (I/O) line (e.g., the I/O circuitry 244) coupled to the sensing circuitry 250. Accordingly, in some embodiments, the sensing circuitry 250 can be configured to perform arithmetic and/or logical operations using the universal number or posit bit strings without encumbering the host 202.

The control circuitry 220 can be configured to receive the one or more bit strings in a format different than the universal number format or the posit format, perform an operation to convert the one or more bit strings from the format different than the universal number format or the posit format to the universal number format or the posit format such that the one or more bit strings have the same bit string shape, and cause the one or more bit strings that are formatted according to the universal number format or the posit format to be transferred to the memory array 230 prior to the controller 240 causing the one or more bit strings that are formatted according to the universal number format or the posit format to be transferred to the sensing circuitry 250. As described herein, the control circuitry 220 can include an arithmetic logic unit, a field programmable gate array, a reduced instruction set computing device, or a combination thereof.

In some embodiments, the controller 240 can be configured to determine that at least two of the one or more bit strings have a same quantity of bits or a same data type associated therewith and cause the sensing circuitry 250 to perform the arithmetic operation, the logical operation, or both using the at least two of the one or more bit strings in response to the determination.

In another non-limiting example, the host 202 can be coupled to a memory device 204, which can include a controller 240, control circuitry 220, and sensing circuitry 250. As described above, the control circuitry 220 can include a memory resource (e.g., the memory resource 124 illustrated in FIG. 1A) configured to receive data comprising a bit string having a first format that provides a first level of precision and logic circuitry (e.g., the logic circuitry 122 illustrated in FIG. 1A) configured to convert the bit string to a second format that provides a second level of precision that is different from the first level of precision. The controller 240 can be configured to cause the bit string having the second format to be transferred to the sensing circuitry 250 and cause the sensing circuitry 250 to perform an arithmetic operation, a logical operation, or both using the bit string having the second format without transferring the bit string having the second format or a result of the bit string having the second format to the host 202. As described above, the first format can comprise a floating-point format or an IEEE 754 format and the second format can comprise a universal number format or a posit format. Further, as described above, the logic circuitry can, in some embodiments, circuitry includes an arithmetic logic unit, a field programmable gate array, a reduced instruction set computing device, or a combination thereof.

Subsequent to performance of the arithmetic operation, the logical operation, or both, the control circuitry 220 can be configured to receive the result of the arithmetic operation, the logical operation, or both and having the second format and convert, using the logic circuitry, the result of the arithmetic operation, the logical operation, or both from the second format to the first format. As described above, one of the first format or the second format can include a mantissa, a base, and an exponent portion, and the other of the first format or the second format can include a mantissa, a sign, a regime, and an exponent portion.

In embodiments in which the arithmetic and/or logical operation is a recursive arithmetic or logical operation, the controller 240 can be configured to cause intermediate exact (e.g., un-rounded) results of the arithmetic operation, the logical operation, or both to be transferred to a plurality of storage locations in a periphery region of the memory device. In some embodiments, the storage location can include sense amplifiers that are in the periphery of the memory array 230.

As described above, in some embodiments, the logic circuitry can be configured to receive the bit string and convert the bit string from the first format to the second format in the absence of receipt of an intervening command from the host 202. Further, in some embodiments, the sensing circuitry 250 can be configured to perform an arithmetic operation, a logical operation, or both using the bit string having the second format in the absence of receipt of an intervening command from the host 202.

Figure 2B:
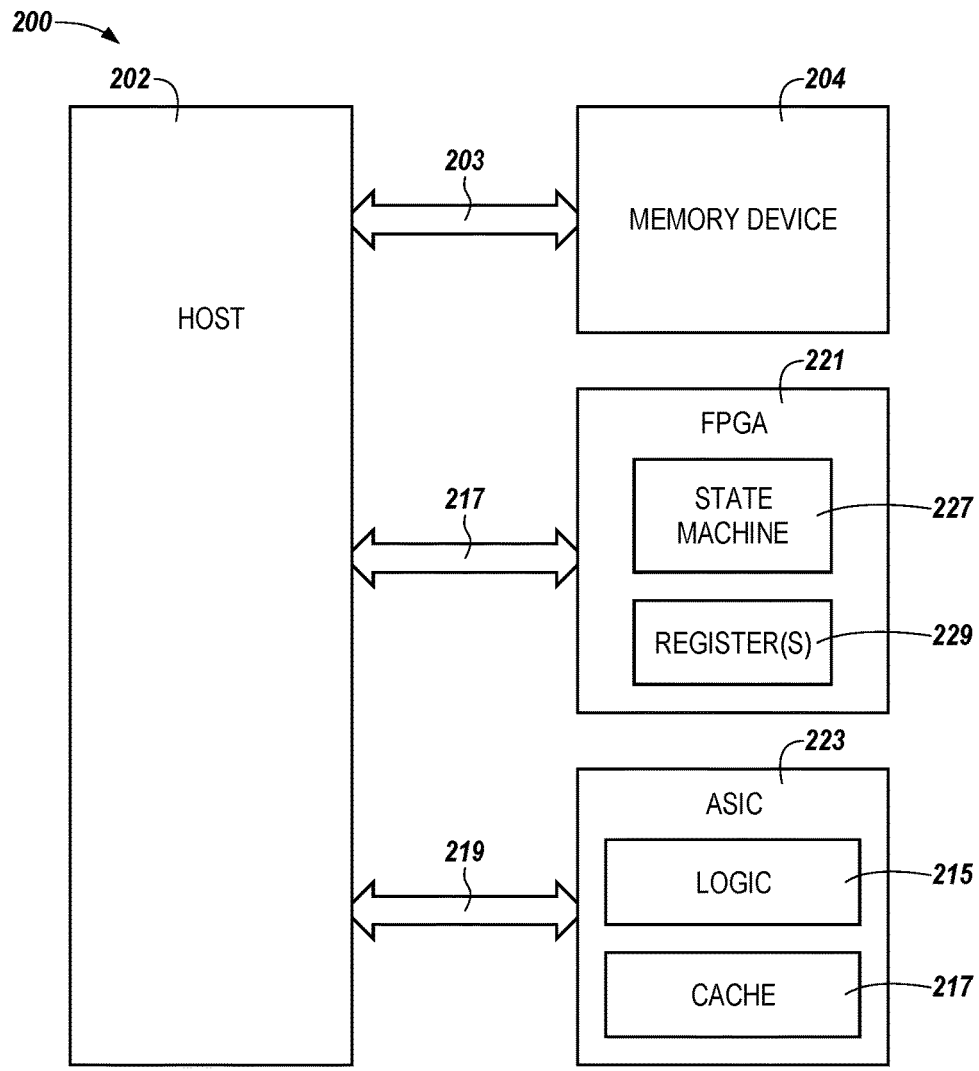
FIG. 2B is another functional block diagram in the form of a computing system including a host, a memory device, an application-specific integrated circuit, and a field programmable gate array in accordance with a number of embodiments of the present disclosure.

FIG. 2B is a functional block diagram in the form of a computing system 200 including a host 202, a memory device 204, an application-specific integrated circuit 223, and a field programmable gate array 221 in accordance with a number of embodiments of the present disclosure. Each of the components (e.g., the host 202, the memory device 204, the FPGA 221, the ASIC 223, etc.) can be separately referred to herein as an "apparatus."

As shown in FIG. 2B, the host 202 can be coupled to the memory device 204 via channel(s) 203, which can be analogous to the channel(s) 203 illustrated in FIG. 2A. The field programmable gate array (FPGA) 221 can be coupled to the host 202 via channel(s) 217 and the application-specific integrated circuit (ASIC) 223 can be coupled to the host 202 via channel(s) 219. In some embodiments, the channel(s) 217 and/or the channel(s) 219 can include a peripheral serial interconnect express (PCIe) interface, however, embodiments are not so limited, and the channel(s) 217 and/or the channel(s) 219 can include other types of interfaces, buses, communication channels, etc. to facilitate transfer of data between the host 202 and the FPGA 221 and/or the ASIC 223.

Figure 6:
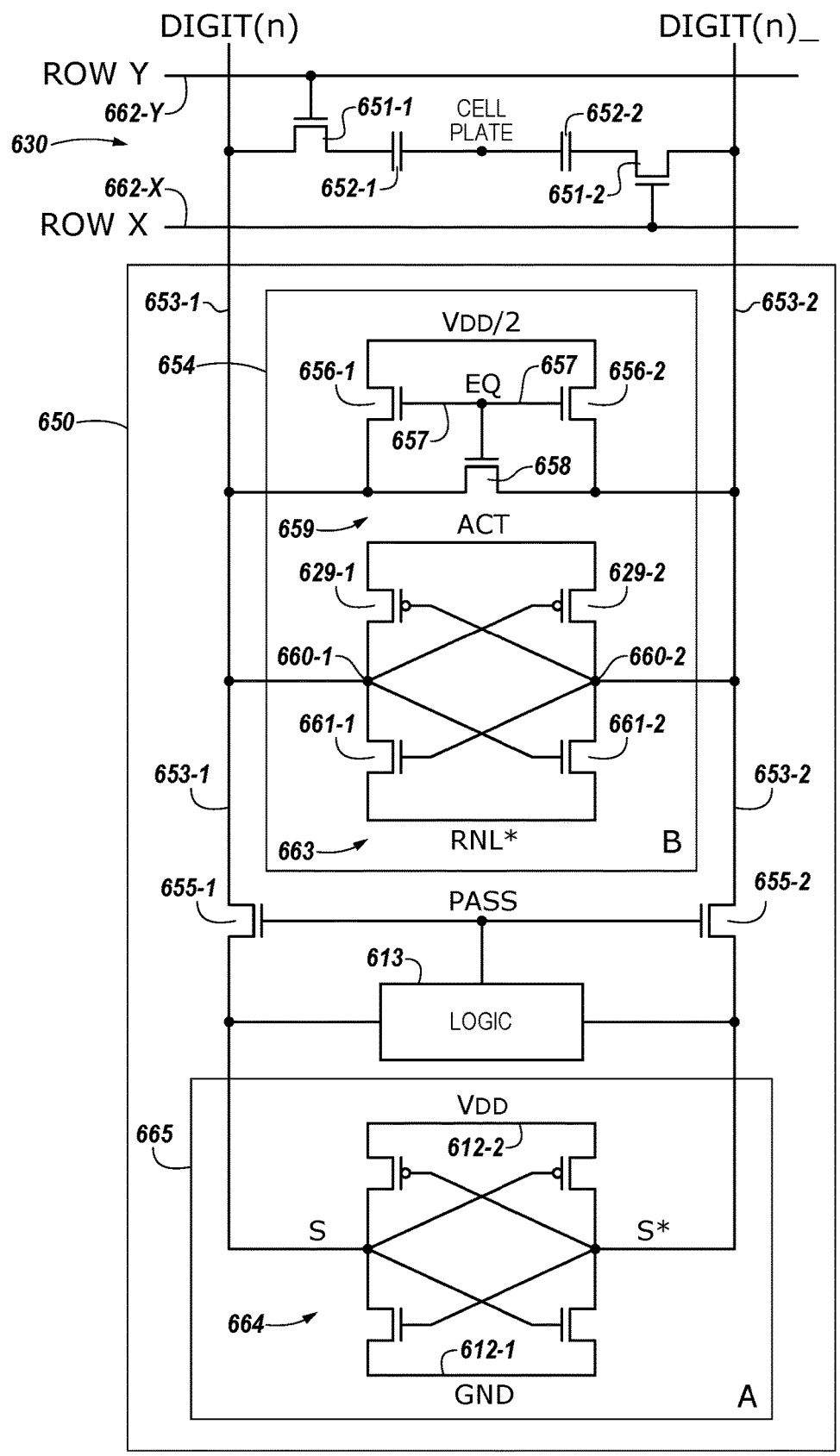
FIG. 6 is a schematic diagram illustrating a portion of a memory array including sensing circuitry in accordance with a number of embodiments of the present disclosure.

As described above, circuitry located on the memory device 204 (e.g., the control circuitry 220 and/or memory array 230 illustrated in FIG. 2A, as well as the sensing component 250/650 illustrated in FIGS. 2A and 6) can perform operations (e.g., operations to convert the bit strings between various formats, arithmetic operations and/or logical operations using the bit strings, etc.) using bit strings formatted in a universal number format or a posit format. Embodiments are not so limited, however, and in some embodiments, the operation(s) can be performed by the FPGA 221 and/or the ASIC 223. As described above, non-limiting examples of arithmetic and/or logical operations that can be performed by the FPGA 221 and/or the ASIC 223 include arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings.

The FPGA 221 can include a state machine 227 and/or register(s) 229. The state machine 227 can include one or more processing devices that are configured to perform operations on an input and produce an output. For example, the FPGA 221 can be configured to receive posit bit strings from the host 202 or the memory device 204 and perform one or more operations using the universal number format or posit format bit strings. The register(s) 229 of the FPGA 221 can be configured to buffer and/or store the posit bit strings received form the host 202 prior to the state machine 227 performing operations using the received bit strings. In addition, the register(s) 229 of the FPGA 221 can be configured to buffer and/or store intermediate results of iterations of recursive operations performed FPGA 221 prior to transferring the result to circuitry external to the ASIC 233, such as the host 202 or the memory device 204, etc.

The ASIC 223 can include logic 215 and/or a cache 217. The logic 215 can include circuitry configured to perform operations on an input and produce an output. In some embodiments, the ASIC 223 is configured to receive universal number format or posit format bit strings from the host 202 and/or the memory device 204 and perform one or more operations using posit bit string operands. The cache 217 of the ASIC 223 can be configured to buffer and/or store the bit strings received form the host 202 prior to the logic 215 performing an operation on the received bit strings. In addition, the cache 217 of the ASIC 223 can be configured to buffer and/or store intermediate results of iterations of recursive operations using the bit strings prior to transferring the result to circuitry external to the ASIC 233, such as the host 202 or the memory device 204, etc.

Although the FPGA 227 is shown as including a state machine 227 and register(s) 229, in some embodiments, the FPGA 221 can include logic, such as the logic 215, and/or a cache, such as the cache 217 in addition to, or in lieu of, the state machine 227 and/or the register(s) 229. Similarly, the ASIC 223 can, in some embodiments, include a state machine, such as the state machine 227, and/or register(s), such as the register(s) 229 in addition to, or in lieu of, the logic 215 and/or the cache 217.

Figure 3:
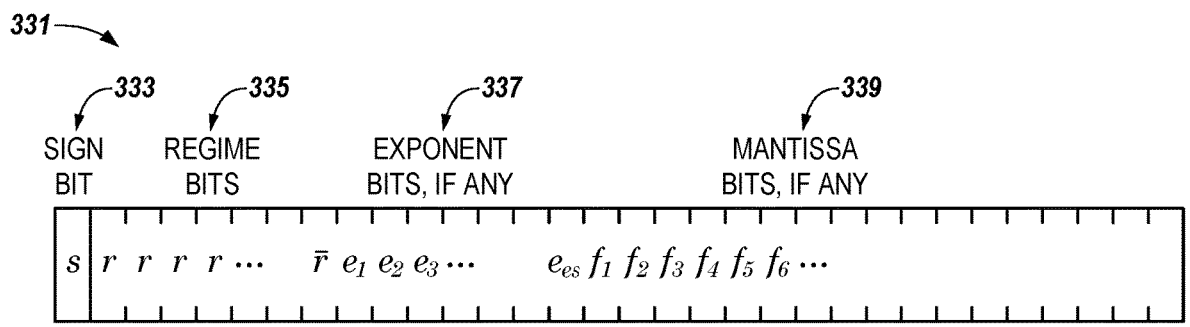
FIG. 3 is an example of an n-bit post with es exponent bits.

FIG. 3 is an example of an n-bit universal number, or "unum" with es exponent bits. In the example of FIG. 3, the n-bit unum is a posit bit string 331. As shown in FIG. 3, the n-bit posit 331 can include a set of sign bit(s) (e.g., a first bit sub-set or a sign bit sub-set 333), a set of regime bits (e.g., a second bit sub-set or the regime bit sub-set 335), a set of exponent bits (e.g., a third bit sub-set or an exponent bit sub-set 337), and a set of mantissa bits (e.g., a fourth bit sub-set or a mantissa bit sub-set 339). The mantissa bits 339 can be referred to in the alternative as a "fraction portion" or as "fraction bits," and can represent a portion of a bit string (e.g., a number) that follows a decimal point.

The sign bit 333 can be zero (0) for positive numbers and one (1) for negative numbers. The regime bits 335 are described in connection with Table 1, below, which shows (binary) bit strings and their related numerical meaning, k. In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| | Binary | | | | | | | |
|---|---|---|---|---|---|---|---|---|
| | 0000 | 0001 | 001X | 01XX | 10XX | 110X | 1110 | 1111 |
| Numerical (k) | −4 | −3 | −2 | −1 | 0 | 1 | 2 | 3 |

In FIG. 3, the regime bits 335 r correspond to identical bits in the bit string, while the regime bits 335 r̄ correspond to an opposite bit that terminates the bit string. For example, for the numerical k value −2 shown in Table 1, the regime bits r correspond to the first two leading zeros, while the regime bit(s) r̄ correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of $useed^k$, where $useed = 2^{2^{es}}$. Several example values for used are shown below in Table 2.

TABLE 2

| es | 0 | 1 | 2 | 3 | 4 |
|---|---|---|---|---|---|
| used | 2 | $2^2 = 4$ | $4^2 = 16$ | $16^2 = 256$ | $256^2 = 65536$ |

The exponent bits 337 correspond to an exponent e, as an unsigned number. In contrast to floating-point numbers, the exponent bits 337 described herein may not have a bias associated therewith. As a result, the exponent bits 337 described herein may represent a scaling by a factor of $2^e$. As shown in FIG. 3, there can be up to es exponent bits ($e_1$, $e_2$, $e_3$, ..., $e_{es}$), depending on how many bits remain to right of the regime bits 335 of the n-bit posit 331. In some embodiments, this can allow for tapered accuracy of the n-bit posit 331 in which numbers which are nearer in magnitude to one have a higher accuracy than numbers which are very large or very small. However, as very large or very small numbers may be utilized less frequent in certain kinds of operations, the tapered accuracy behavior of the n-bit posit 331 shown in FIG. 3 may be desirable in a wide range of situations.

The mantissa bits 339 (or fraction bits) represent any additional bits that may be part of the n-bit posit 331 that lie to the right of the exponent bits 337. Similar to floating-point bit strings, the mantissa bits 339 represent a fraction f, which can be analogous to the fraction 1.f where f includes one or more bits to the right of the decimal point following the one. In contrast to floating-point bit strings, however, in the n-bit posit 331 shown in FIG. 3, the "hidden bit" (e.g., the one) may always be one (e.g., unity), whereas floating-point bit strings may include a subnormal number with a "hidden bit" of zero (e.g., 0.f).

As described herein, alter a numerical value or a quantity of bits of one of more of the sign 333 bit sub-set, the regime 335 bit sub-set, the exponent 337 bit sub-set, or the mantissa 339 bit sub-set can vary the precision of the n-bit posit 331. For example, changing the total number of bits in the n-bit posit 331 can alter the resolution of the n-bit posit bit string 331. That is, an 8-bit posit can be converted to a 16-bit posit by, for example, increasing the numerical values and/or the quantity of bits associated with one or more of the posit bit string's constituent bit sub-sets to increase the resolution of the posit bit string. Conversely, the resolution of a posit bit string can be decreased for example, from a 64-bit resolution to a 32-bit resolution by decreasing the numerical values and/or the quantity of bits associated with one or more of the posit bit string's constituent bit sub-sets.

In some embodiments, altering the numerical value and/or the quantity of bits associated with one or more of the regime 335 bit sub-set, the exponent 337 bit sub-set, and/or the mantissa 339 bit sub-set to vary the precision of the n-bit posit 331 can lead to an alteration to at least one of the other of the regime 335 bit sub-set, the exponent 337 bit sub-set, and/or the mantissa 339 bit sub-set. For example, when altering the precision of the n-bit posit 331 to increase the resolution of the n-bit posit bit string 331 (e.g., when performing an "up-convert" operation to increase the bit width of the n-bit posit bit string 331), the numerical value and/or the quantity of bits associated with one or more of the regime 335 bit sub-set, the exponent 337 bit sub-set, and/or the mantissa 339 bit sub-set may be altered.

In a non-limiting example in which the resolution of the n-bit posit bit string 331 is increased (e.g., the precision of the n-bit posit bit string 331 is varied to increase the bit width of the n-bit posit bit string 331) but the numerical value or the quantity of bits associated with the exponent 337 bit sub-set does not change, the numerical value or the quantity of bits associated with the mantissa 339 bit sub-set may be increased. In at least one embodiment, increasing the numerical value and/or the quantity of bits of the mantissa 339 bit sub-set when the exponent 338 bit sub-set remains unchanged can include adding one or more zero bits to the mantissa 339 bit sub-set.

In another non-limiting example in which the resolution of the n-bit posit bit string 331 is increased (e.g., the precision of the n-bit posit bit string 331 is varied to increase the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In another example in which the resolution of the n-bit posit bit string 331 is increased (e.g., the precision of the n-bit posit bit string 331 is varied to increase the bit width of the n-bit posit bit string 331), the numerical value and/or the quantity of bits associated with the exponent 335 bit sub-set may be increased and the numerical value and/or the quantity of bits associated with the regime 333 bit sub-set may be decreased. Conversely, in some embodiments, the numerical value and/or the quantity of bits associated with the exponent 335 bit sub-set may be decreased and the numerical value and/or the quantity of bits associated with the regime 333 bit sub-set may be increased.

In a non-limiting example in which the resolution of the n-bit posit bit string 331 is decreased (e.g., the precision of the n-bit posit bit string 331 is varied to decrease the bit width of the n-bit posit bit string 331) but the numerical value or the quantity of bits associated with the exponent 337 bit sub-set does not change, the numerical value or the quantity of bits associated with the mantissa 339 bit sub-set may be decreased. In at least one embodiment, decreasing the numerical value and/or the quantity of bits of the mantissa 339 bit sub-set when the exponent 338 bit sub-set remains unchanged can include truncating the numerical value and/or the quantity of bits associated with the mantissa 339 bit sub-set.

In another non-limiting example in which the resolution of the n-bit posit bit string 331 is decreased (e.g., the precision of the n-bit posit bit string 331 is varied to decrease the bit width of the n-bit posit bit string 331) by altering the numerical value and/or the quantity of bits associated with the exponent 337 bit sub-set, the numerical value and/or the quantity of bits associated with the regime 335 bit sub-set and/or the mantissa 339 bit sub-set may be either increased or decreased. For example, if the numerical value and/or the quantity of bits associated with the exponent 337 bit sub-set is increased or decreased, corresponding alterations may be made to the numerical value and/or the quantity of bits associated with the regime 335 bit sub-set and/or the mantissa 339 bit sub-set. In at least one embodiment, increasing or decreasing the numerical value and/or the quantity of bits associated with the regime 335 bit sub-set and/or the mantissa 339 bit sub-set can include adding one or more zero bits to the regime 335 bit sub-set and/or the mantissa 339 bit sub-set and/or truncating the numerical value or the quantity of bits associated with the regime 335 bit sub-set and/or the mantissa 339 bit sub-set.

In some embodiments, changing the numerical value and/or a quantity of bits in the exponent bit sub-set can alter the dynamic range of the n-bit posit 331. For example, a 32-bit posit bit string with an exponent bit sub-set having a numerical value of zero (e.g., a 32-bit posit bit string with es=0, or a (32,0) posit bit string) can have a dynamic range of approximately 18 decades. However, a 32-bit posit bit string with an exponent bit sub-set having a numerical value of 3 (e.g., a 32-bit posit bit string with es=3, or a (32,3) posit bit string) can have a dynamic range of approximately 145 decades.

Figure 4A:
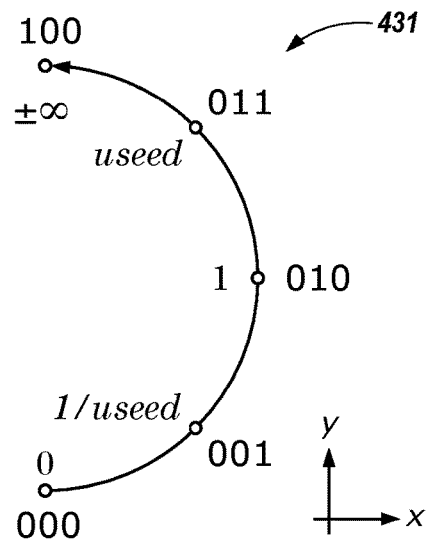
FIG. 4A is an example of positive values for a 3-bit posit.

FIG. 4A is an example of positive values for a 3-bit posit. In FIG. 4A, only the right half of projective real numbers, however, it will be appreciated that negative projective real numbers that correspond to their positive counterparts shown in FIG. 4A can exist on a curve representing a transformation about they-axis of the curves shown in FIG. 4A.

In the example of FIG. 4A, es=2, so useed=$2^{2^{es}}$=16. The precision of a posit 431-1 can be increased by appending bits the bit string, as shown in FIG. 4B. For example, appending a bit with a value of one (1) to bit strings of the posit 431-1 increases the accuracy of the posit 431-1 as shown by the posit 431-2 in FIG. 4B. Similarly, appending a bit with a value of one to bit strings of the posit 431-2 in FIG. 4B increases the accuracy of the posit 431-2 as shown by the posit 431-3 shown in FIG. 4B. An example of interpolation rules that may be used to append bits to the bits strings of the posits 431-1 shown in FIG. 4A to obtain the posits 431-2, 431-3 illustrated in FIG. 4B follow.

If maxpos is the largest positive value of a bit string of the posits 431-1, 431-2, 431-3 and minpos is the smallest value of a bit string of the posits 431-1, 431-2, 431-3, maxpos may be equivalent to useed and minpos may be equivalent to $$\frac{1}{useed}.$$

Between maxpos an ±∞, a new bit value may be maxpos*useed, and between zero and minpos, a new bit value may be $$\frac{minpos}{useed}.$$

These new bit values can correspond to a new regime bit 335. Between existing values $x=2^m$ and $y=2^n$, where m and n differ by more than one, the new bit value may be given by the geometric mean:

$$\sqrt{x \times y} = 2^{\frac{(m+n)}{2}},$$

which corresponds to a new exponent bit 337. If the new bit value is midway between the existing x and y values next to it, the new bit value can represent the arithmetic mean $$\frac{x+y}{2},$$

which corresponds to a new mantissa bit 339.

Figure 4B:
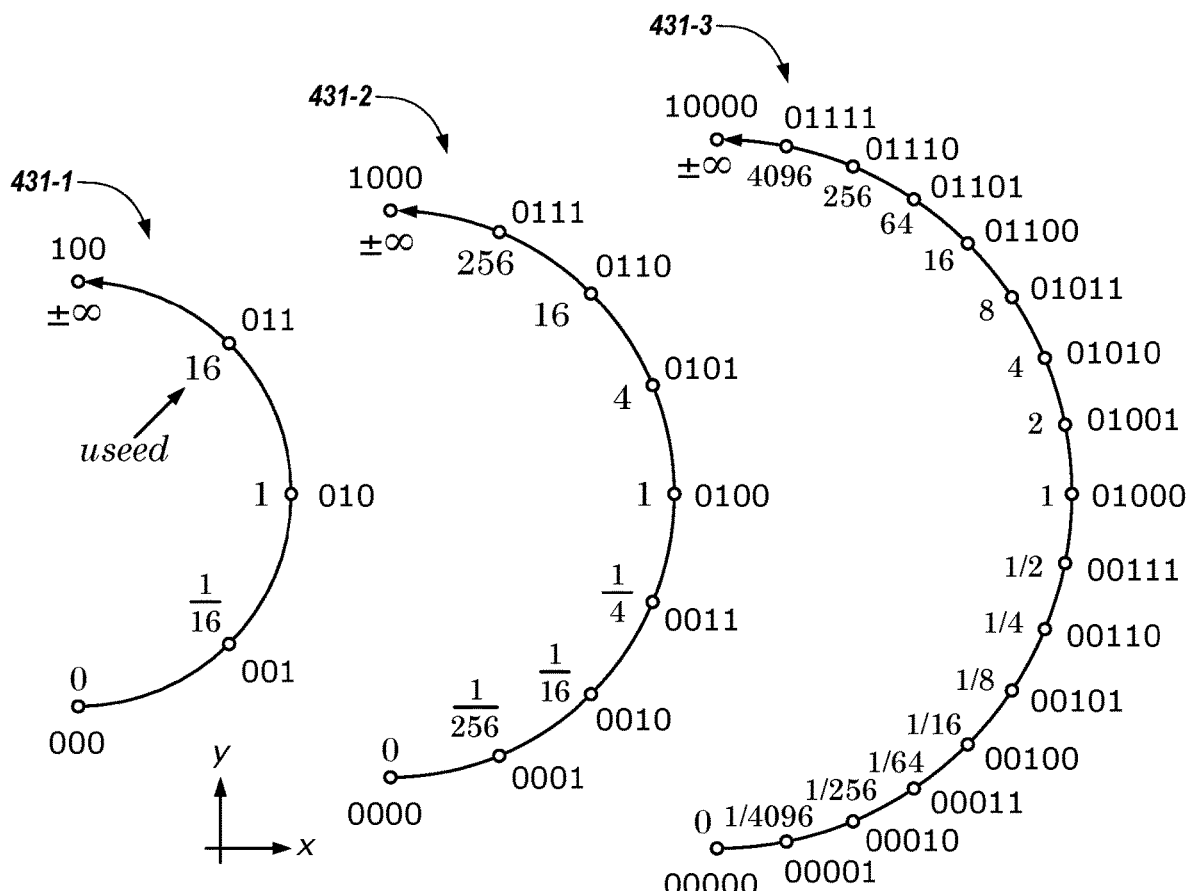
FIG. 4B is an example of posit construction using two exponent bits.

FIG. 4B is an example of posit construction using two exponent bits. In FIG. 4B, only the right half of projective real numbers, however, it will be appreciated that negative projective real numbers that correspond to their positive counterparts shown in FIG. 4B can exist on a curve representing a transformation about the y-axis of the curves shown in FIG. 4B. The posits 431-1, 431-2, 431-3 shown in FIG. 4B each include only two exception values: Zero (0) when all the bits of the bit string are zero and ±∞ when the bit string is a one (1) followed by all zeros. It is noted that the numerical values of the posits 431-1, 431-2, 431-3 shown in FIG. 4 are exactly $useed^k$. That is, the numerical values of the posits 431-1, 431-2, 431-3 shown in FIG. 4 are exactly useed to the power of the k value represented by the regime (e.g., the regime bits 335 described above in connection with FIG. 3). In FIG. 4B, the posit 431-1 has es=2, so useed=$2^{2^{es}}$=16, the posit 431-2 has es=3, so useed=$2^{2^{es}}$=256, and the posit 431-3 has es=4, so useed=$2^{2^{es}}$=4096.

As an illustrative example of adding bits to the 3-bit posit 431-1 to create the 4-bit posit 431-2 of FIG. 4B, the useed=256, so the bit string corresponding to the useed of 256 has an additional regime bit appended thereto and the former useed, 16, has a terminating regime bit (r̄) appended thereto. As described above, between existing values, the corresponding bit strings have an additional exponent bit appended thereto. For example, the numerical values 1/16, 1/4, 1, and 4 will have an exponent bit appended thereto. That is, the final one corresponding to the numerical value 4 is an exponent bit, the final zero corresponding o the numerical value 1 is an exponent bit, etc. This pattern can be further seen in the posit 431-3, which is a 5-bit posit generated according to the rules above from the 4-bit posit 431-2. If another bit was added to the posit 431-3 in FIG. 4B to generate a 6-bit posit, mantissa bits 339 would be appended to the numerical values between 1/16 and 16.

A non-limiting example of decoding a posit (e.g., a posit 431) to obtain its numerical equivalent follows. In some embodiments, the bit string corresponding to a posit p is an unsigned integer ranging from $-2^{n-1}$ to $2^{n-1}$, k is an integer corresponding to the regime bits 335 and e is an unsigned integer corresponding to the exponent bits 337. If the set of mantissa bits 339 is represented as $\{f_1 f_2, \ldots, f_{fs}\}$ and f is a value represented by $1.f_1 f_2, \ldots, f_{fs}$ (e.g., by a one followed by a decimal point followed by the mantissa bits 339), the p can be given by Equation 2, below.

$$x = \begin{cases} 0, & p = 0 \\ \pm\infty, & p = -2^{n-1} \\ sign(p) \times useed^k \times 2^e \times f, & \text{all other } p \end{cases}$$

Equation 2

A further illustrative example of decoding a posit bit string is provided below in connection with the posit bit string 0000110111011101 shown in Table 3, below follows.

TABLE 3

| SIGN | REGIME | EXPONENT | MANTISSA |
|------|--------|----------|----------|
| 0    | 0001   | 101      | 11011101 |

In Table 3, the posit bit string 0000110111011101 is broken up into its constituent sets of bits (e.g., the sign bit 333, the regime bits 335, the exponent bits 337, and the mantissa bits 339). Since es=3 in the posit bit string shown in Table 3 (e.g., because there are three exponent bits), useed=256. Because the sign bit 333 is zero, the value of the numerical expression corresponding to the posit bit string shown in Table 3 is positive. The regime bits 335 have a run of three consecutive zeros corresponding to a value of −3 (as described above in connection with Table 1). As a result, the scale factor contributed by the regime bits 335 is $256^{-3}$ (e.g., $useed^k$). The exponent bits 337 represent five (5) as an unsigned integer and therefore contribute an additional scale factor of $2^e=2^5=32$. Lastly, the mantissa bits 339, which are given in Table 3 as 11011101, represent two-hundred and twenty-one (221) as an unsigned integer, so the mantissa bits 339, given above as f are $$f + \frac{221}{256}.$$

Using these values and Equation 2, the numerical value corresponding to the posit bit string given in Table 3 is $$+256^{-3} \times 2^5 \times \left(1 + \frac{221}{256}\right) = \frac{437}{134217728} \approx 3.55393 \times 10^{-6}.$$

Figure 5:
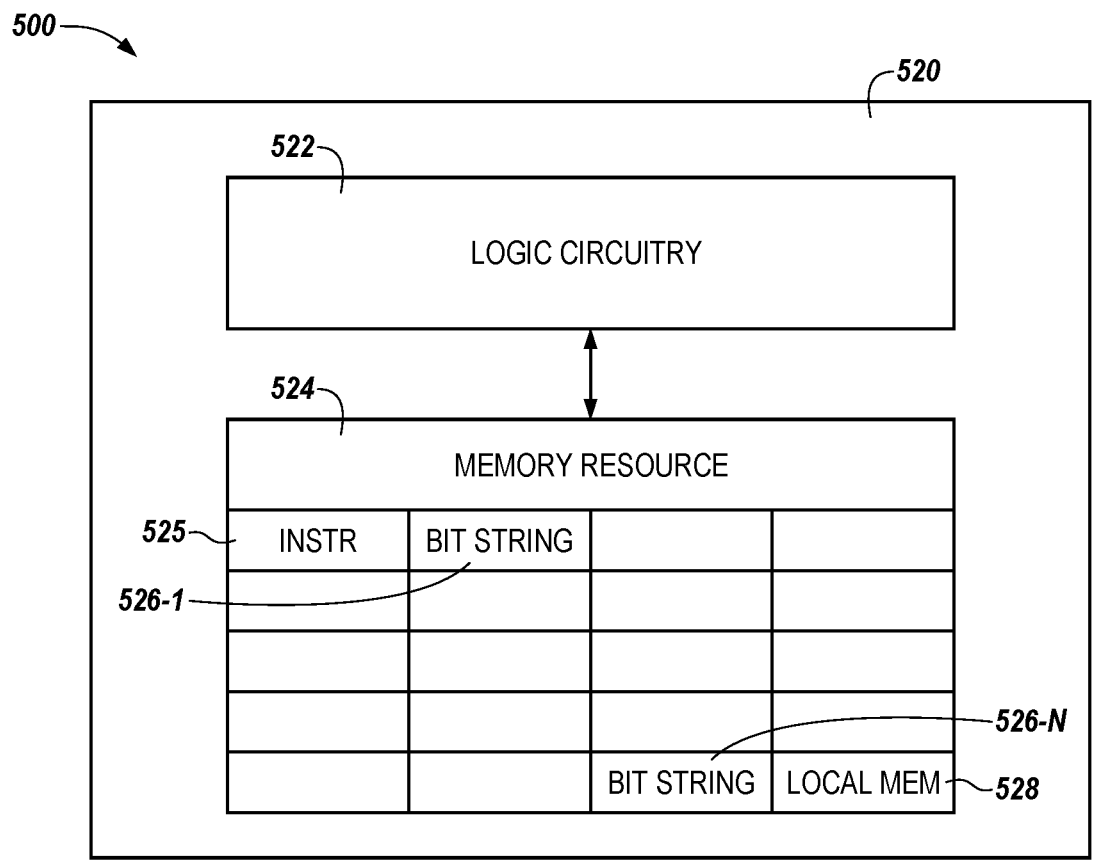
FIG. 5 is a functional block diagram in the form of control circuitry in accordance with a number of embodiments of the present disclosure.

FIG. 5 is a functional block diagram in the form of an apparatus 500 including control circuitry 520 in accordance with a number of embodiments of the present disclosure. The control circuitry 520 can include logic circuitry 522 and a memory resource 524, which can be analogous to the logic circuitry 122 and the memory resource 124 illustrated in FIG. 1, herein. The logic circuitry 522 and/or the memory resource 524 can separately be considered an "apparatus."

The control circuitry 520 can be configured to receive a command (e.g., an initiation command) from a host (e.g., the host 102/202 illustrated in FIGS. 1 and 2, herein) and/or a controller (e.g., the controller 210 illustrated in FIG. 2, herein) to initiate performance of one or more operations (e.g., conversion operations, etc.) on data stored in the memory resource 524. Once the initiation command has been received by the control circuitry 520, the control circuitry 520 can perform the operations (e.g., the conversion operation(s) and/or operations to cause the sensing circuitry to perform arithmetic and/or logical operations using the converted bit strings) described above in the absence of intervening commands from the host and/or the controller. For example, the control circuitry 520 can include sufficient processing resources and/or instructions to perform operations on the bit strings stored in the memory resource 524 without receiving additional commands from circuitry external to the control circuitry 520.

The logic circuitry 522 can be an arithmetic logic unit (ALU), a state machine, sequencer, controller, an instruction set architecture, one or more processors (e.g., processing device(s) or processing unit(s)), or other type of control circuitry. As described above, an ALU can include circuitry to perform operations (e.g., conversion operations convert bit strings between various formats that supports different levels of precision, etc.) such as the operations described above, using integer binary numbers, such as bit strings in the universal number or posit format. An instruction set architecture (ISA) can include a reduced instruction set computing (RISC) device. In embodiments in which the logic circuitry 522 includes a RISC device, the RISC device can include a processing resource or processing unit that can employ an instruction set architecture (ISA) such as a RISC-V ISA, however, embodiments are not limited to RISC-V ISAs and other processing devices and/or ISAs can be used.

In some embodiments, the logic circuitry 522 can be configured to execute instructions (e.g., instructions stored in the INSTR 525 portion of the memory resource 524) to perform the operations herein. For example, the logic circuitry 524 is provisioned with sufficient processing resources to cause performance of operations to convert the bits strings between various formats and/or cause the sensing circuitry to perform arithmetic and/or logical operations using the converted bit strings received by the control circuitry 520.

Once the operation(s) are performed by the logic circuitry 522, the resultant bit strings can be stored in the memory resource 524 and/or a memory array (e.g., the memory array 230 illustrated in FIG. 2, herein). The stored resultant bit strings can be addressed such that it is accessible for performance of the operations. For example, the bit strings can be stored in the memory resource 524 and/or the memory array at particular physical addresses (which may have corresponding logical addresses corresponding thereto) such that the bit strings can be accessed in performing the operations. In some embodiments, the bit strings can be transferred to a memory array, such as the memory array 130/230 illustrated in FIGS. 1A-1B and 2A-2B, and/or the sensing circuitry such as the sensing circuitry 250 illustrated in FIG. 2A, which can perform subsequent operations (e.g., arithmetic and/or logical operations) using the bit strings.

The memory resource 524 can, in some embodiments, be a memory resource such as random-access memory (e.g., RAM, SRAM, etc.). Embodiments are not so limited, however, and the memory resource 524 can include various registers, caches, buffers, and/or memory arrays (e.g., 1T1C, 2T2C, 3T, etc. DRAM arrays). The memory resource 524 can be configured to receive a bit string(s) from, for example, a host such as the host 202 illustrated in FIGS. 2A-2B and/or a memory array such as the memory array 230 illustrated in FIG. 2A, herein. In some embodiments, the memory resource 538 can have a size of approximately 256 kilobytes (KB), however, embodiments are not limited to this particular size, and the memory resource 524 can have a size greater than, or less than, 256 KB.

The memory resource 524 can be partitioned into one or more addressable memory regions. As shown in FIG. 5, the memory resource 524 can be partitioned into addressable memory regions so that various types of data can be stored therein. For example, one or more memory regions can store instructions ("INSTR") 525 used by the memory resource 524, one or more memory regions can store bit strings 526-1, . . . , 526-N (e.g., data such as a bit string retrieved from the host and/or the memory array), and/or one or more memory regions can serve as a local memory ("LOCAL MEM.") 528 portion of the memory resource 538. Although 20 distinct memory regions are shown in FIG. 5, it will be appreciated that the memory resource 524 can be partitioned into any number of distinct memory regions.

As discussed above, the bit string(s) can be retrieved from the host and/or memory array in response to messages and/or commands generated by the host, a controller (e.g., the controller 210 illustrated in FIG. 2, herein), or the logic circuitry 522. In some embodiments, the commands and/or messages can be processed by the logic circuitry 522. Once the bit string(s) are received by the control circuitry 520 and stored in the memory resource 524, they can be processed by the logic circuitry 522. Processing the bit string(s) by the logic circuitry 522 can include performing operations to convert the bit strings between various formats in addition to recursive operations such as multiply-accumulate operations, using the converted (e.g., universal number or posit formatted) bit strings as operands.

In a non-limiting neural network training application, the control circuitry 520 can convert a 16-bit posit with es=0 into an 8-bit posit with es=0 for use in a neural network training application. In some approaches, a half-precision 16-bit floating-point bit string can be used for neural network training, however, in contrast to some approaches that utilize a half-precision 16-bit floating-point bit string for neural network training, an 8-bit posit bit string with es=0 can provide comparable neural network training results two to four times faster than the half-precision 16-bit floating-point bit string.

For example, if the control circuitry 520 receives a 16-bit posit bit string with es=0 for use in a neural network training application, the control circuitry 520 can selectively remove bits from one or more bit sub-sets of the 16-bit posit bit string to vary the precision of the 16-bit posit bit string to an 8-bit posit bit string with es=0. It will be appreciated that embodiments are not so limited, and the control circuitry 520 can vary the precision of the bit string to produce an 8-bit posit bit string with es=1 (or some other value). In addition, the control circuitry 520 can vary the precision of the 16-bit posit bit string to yield a 32-bit posit bit string (or some other value).

During performance of the operations connected with the above example, the control circuitry 520 can be configured to cause results of the operation at each iteration to be stored in circuitry in the periphery of a memory device or memory array. For example, the control circuitry 520 can be configured to cause results of the operation at each iteration to be stored in a plurality of peripheral sense amplifiers such as the periphery logic 270 illustrated in FIG. 2A. These intermediate results can be used in subsequent iterations of a recursive operation in the context of a neural network training application to improve the accuracy of the final result of the operation, as described herein. In some embodiments, the operations may be performed by sensing circuitry (e.g., the sensing circuitry 250 illustrated in FIG. 2A) and exact (e.g., un-rounded) intermediate results of the operations can be stored in the periphery logic 270.

A common function used in training neural networks is a sigmoid function f(x) (e.g., a function that asymptotically approaches zero as x→−∞ and asymptotically approaches 1 as x→∞). An example of a sigmoid function that may be used in neural network training applications is $$\frac{1}{1+e^{-x}},$$

which can require upwards of one-hundred clock cycles to compute using half-precision 16-bit floating-point bit strings. However, using an 8-bit posit with es=0, the same function can be evaluated by flipping the first bit of the posit representing x and shifting two bits to the right—operations that may take at least an order of magnitude fewer clock signals in comparison to evaluation of the same function using a half-precision 16-bit floating-point bit string.

By allowing for results of iterations of the evaluation of the sigmoid function to be preserved without rounding or truncating the results of the iterations, the accuracy of the final result can be improved in comparison to approaches in which intermediate results of the operation are rounded or truncated. For example, by storing intermediate results of a recursive operation performed using the sensing circuitry to evaluate a sigmoid function in, for example, periphery sense amplifiers such as the periphery logic 270 illustrated in FIG. 2A, the accuracy of the final result can be improved in comparison to approaches in which intermediate results of the operation are rounded or truncated.

In this example, by operating the control circuitry 520 to vary the precision of the posit bit string to yield a more desirable level of precision, processing time, resource consumption, and/or storage space can be reduced in comparison to approaches that do not include control circuitry 520 configured to perform such conversion and/or subsequent operations. This reduction in processing time, resource consumption, and/or storage space can improve the function of a computing device in which the control circuitry 520 is operating by reducing the number of clock signals used in performing such operations, which may reduce an amount of power consumed by the computing device and/or an amount of time to perform such operations, as well as by freeing up processing and/or memory resources for other tasks and functions.

FIG. 6 is a schematic diagram illustrating a portion of a memory array 630 including sensing circuitry in accordance with a number of embodiments of the present disclosure. The sensing component 650 represents one of a number of sensing components that can correspond to sensing circuitry 150/250 shown in FIGS. 1B and 2A.

In the example shown in FIG. 6, the memory array 630 is a DRAM array of 1T1C (one transistor one capacitor) memory cells in which a transistor serves as the access device and a capacitor serves as the storage element; although other embodiments of configurations can be used (e.g., 2T2C with two transistors and two capacitors per memory cell). In this example, a first memory cell comprises transistor 651-1 and capacitor 652-1, and a second memory cell comprises transistor 651-2 and capacitor 652-2, etc. In a number of embodiments, the memory cells may be destructive read memory cells (e.g., reading the data stored in the cell destroys the data such that the data originally stored in the cell is refreshed after being read).

The cells of the memory array 630 can be arranged in rows coupled by access lines 662-X (Row X), 662-Y (Row Y), etc., and columns coupled by pairs of complementary sense lines (e.g., digit lines 653-1 labelled DIGIT(n) and 653-2 labelled DIGIT(n)_ in FIG. 6). Although only one pair of complementary digit lines are shown in FIG. 6, embodiments of the present disclosure are not so limited, and an array of memory cells can include additional columns of memory cells and digit lines (e.g., 4,096, 8,192, 16,384, etc.).

Memory cells can be coupled to different digit lines and word lines. For instance, in this example, a first source/drain region of transistor 651-1 is coupled to digit line 653-1, a second source/drain region of transistor 651-1 is coupled to capacitor 652-1, and a gate of transistor 651-1 is coupled to word line 662-Y. A first source/drain region of transistor 651-2 is coupled to digit line 653-2, a second source/drain region of transistor 651-2 is coupled to capacitor 652-2, and a gate of transistor 651-2 is coupled to word line 662-X. A cell plate, as shown in FIG. 6, can be coupled to each of capacitors 652-1 and 652-2. The cell plate can be a common node to which a reference voltage (e.g., ground) can be applied in various memory array configurations.

The digit lines 653-1 and 653-2 of memory array 630 are coupled to sensing component 650 in accordance with a number of embodiments of the present disclosure. In this example, the sensing component 650 comprises a sense amplifier 654 and a compute component 665 corresponding to a respective column of memory cells (e.g., coupled to a respective pair of complementary digit lines). The sense amplifier 654 is coupled to the pair of complementary digit lines 653-1 and 653-2. The compute component 665 is coupled to the sense amplifier 654 via pass gates 655-1 and 655-2. The gates of the pass gates 655-1 and 655-2 can be coupled to selection logic 613.

The selection logic 613 can include pass gate logic for controlling pass gates that couple the pair of complementary digit lines un-transposed between the sense amplifier 654 and the compute component 665 and swap gate logic for controlling swap gates that couple the pair of complementary digit lines transposed between the sense amplifier 654 and the compute component 665. The selection logic 613 can be coupled to the pair of complementary digit lines 653-1 and 653-2 and configured to perform logical operations on data stored in array 630. For instance, the selection logic 613 can be configured to control continuity of (e.g., turn on/turn off) pass gates 655-1 and 655-2 based on a selected logical operation that is being performed.

The sense amplifier 654 can be operated to determine a data value (e.g., logic state) stored in a selected memory cell. The sense amplifier 654 can comprise a cross coupled latch 615 (e.g., gates of a pair of transistors, such as n-channel transistors 661-1 and 661-2 are cross coupled with the gates of another pair of transistors, such as p-channel transistors 629-1 and 629-2), which can be referred to herein as a primary latch. However, embodiments are not limited to this example.

In operation, when a memory cell is being sensed (e.g., read), the voltage on one of the digit lines 653-1 or 653-2 will be slightly greater than the voltage on the other one of digit lines 653-1 or 653-2. An ACT signal and an RNL* signal can be driven low to enable (e.g., fire) the sense amplifier 654. The digit line 653-1 or 653-2 having the lower voltage will turn on one of the transistors 629-1 or 629-2 to a greater extent than the other of transistors 629-1 or 629-2, thereby driving high the digit line 654-1 or 654-2 having the higher voltage to a greater extent than the other digit line 654-1 or 654-2 is driven high.

Similarly, the digit line 654-1 or 654-2 having the higher voltage will turn on one of the transistors 661-1 or 661-2 to a greater extent than the other of the transistors 661-1 or 661-2, thereby driving low the digit line 654-1 or 654-2 having the lower voltage to a greater extent than the other digit line 654-1 or 654-2 is driven low. As a result, after a short delay, the digit line 654-1 or 654-2 having the slightly greater voltage is driven to the voltage of the supply voltage $V_{CC}$ through a source transistor, and the other digit line 654-1 or 654-2 is driven to the voltage of the reference voltage (e.g., ground) through a sink transistor. Therefore, the cross coupled transistors 661-1 and 661-2 and transistors 629-1 and 629-2 serve as a sense amplifier pair, which amplify the differential voltage on the digit lines 654-1 and 654-2 and operate to latch a data value sensed from the selected memory cell.

Embodiments are not limited to the sensing component configuration illustrated in FIG. 6. As an example, the sense amplifier 654 can be a current-mode sense amplifier and/or a single-ended sense amplifier (e.g., sense amplifier coupled to one digit line). Also, embodiments of the present disclosure are not limited to a folded digit line architecture such as that shown in FIG. 6.

The sensing component 650 can be one of a plurality of sensing components selectively coupled to a shared I/O line. As such, the sensing component 650 can be used in association with reversing data stored in memory in accordance with a number of embodiments of the present disclosure.

In this example, the sense amplifier 654 includes equilibration circuitry 659, which can be configured to equilibrate the digit lines 654-1 and 654-2. The equilibration circuitry 659 comprises a transistor 658 coupled between digit lines 654-1 and 654-2. The equilibration circuitry 659 also comprises transistors 656-1 and 656-2 each having a first source/drain region coupled to an equilibration voltage (e.g., $V_{DD}$/2), where $V_{DD}$ is a supply voltage associated with the array. A second source/drain region of transistor 656-1 is coupled to digit line 654-1, and a second source/drain region of transistor 656-2 is coupled to digit line 654-2. Gates of transistors 658, 656-1, and 656-2 can be coupled together and to an equilibration (EQ) control signal line 657. As such, activating EQ enables the transistors 658, 656-1, and 656-2, which effectively shorts digit lines 654-1 and 654-2 together and to the equilibration voltage (e.g., $V_{DD}$/2). Although FIG. 6 shows sense amplifier 654 comprising the equilibration circuitry 659, embodiments are not so limited, and the equilibration circuitry 659 may be implemented discretely from the sense amplifier 654, implemented in a different configuration than that shown in FIG. 6, or not implemented at all.

As shown in FIG. 6, the compute component 665 can also comprise a latch, which can be referred to herein as a secondary latch 664. The secondary latch 664 can be configured and operated in a manner similar to that described above with respect to the primary latch 663, with the exception that the pair of cross coupled p-channel transistors (e.g., PMOS transistors) included in the secondary latch can have their respective sources coupled to a supply voltage 612-2 (e.g., $V_{DD}$), and the pair of cross coupled n-channel transistors (e.g., NMOS transistors) of the secondary latch can have their respective sources selectively coupled to a reference voltage 612-1 (e.g., ground), such that the secondary latch is continuously enabled. The configuration of the compute component 665 is not limited to that shown in FIG. 6, and various other embodiments are feasible.

Figure 7A:
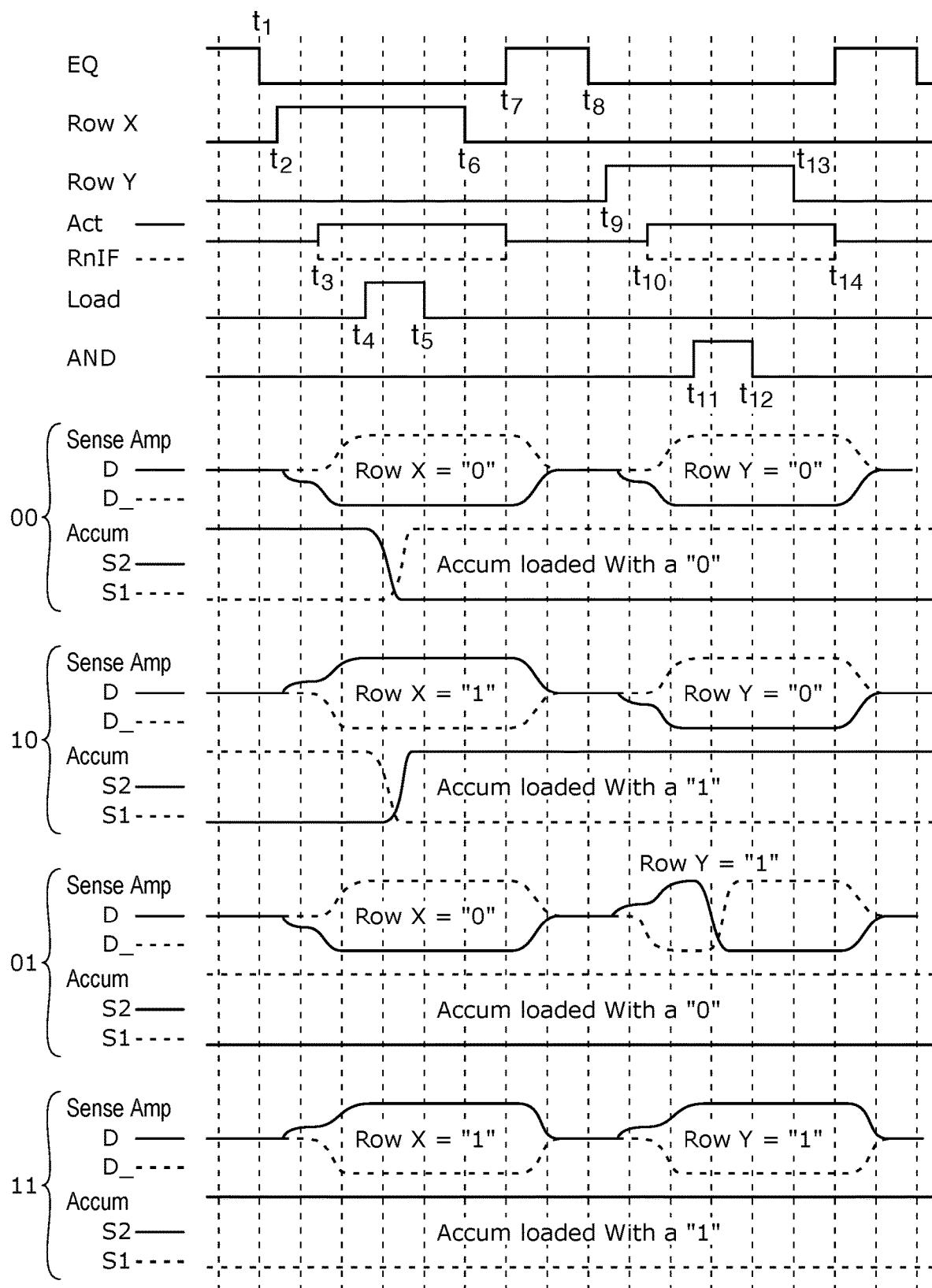
FIGS. 7A-7B illustrate timing diagrams associated with performing a number of logical operations using sensing circuitry in accordance with a number of embodiments of the present disclosure.
Figure 7B:
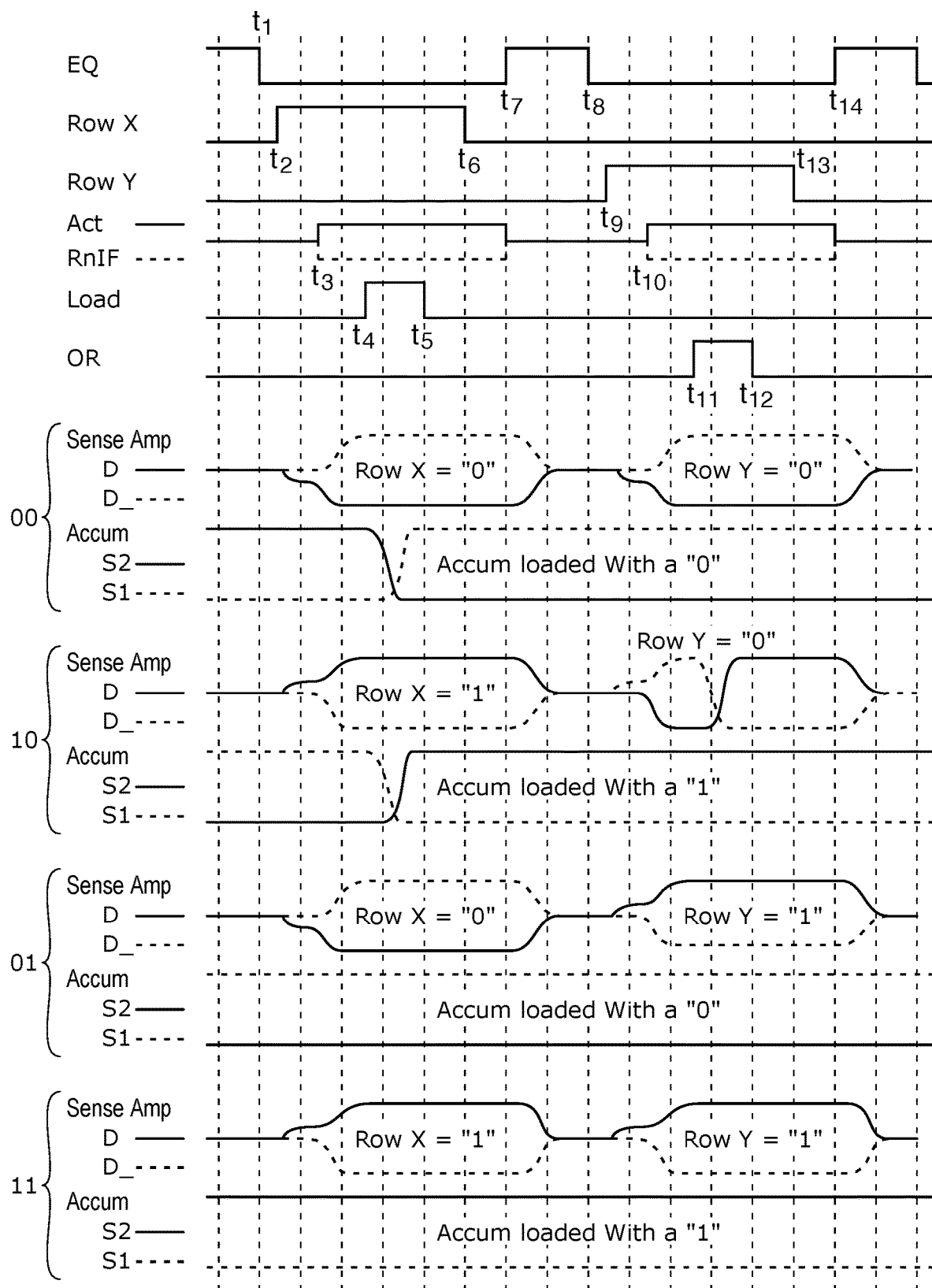

FIGS. 7A-7B illustrate timing diagrams associated with performing a number of logical operations using sensing circuitry in accordance with a number of embodiments of the present disclosure. FIG. 7A illustrates a number of control signals associated with operating sensing circuitry (e.g., 650 in FIG. 6) to perform the AND logical operation. "EQ" corresponds to an equilibrate signal applied to the sense amp 654, "ROW X" corresponds to an activation signal applied to access line 662-X, "ROW Y" corresponds to an activation signal applied to access line 662-Y, "Act" and "RnIF" correspond to a respective active positive and negative control signal applied to the sense amp 654, "LOAD" corresponds to a load control signal (e.g., a load control signal applied to the primary latch 663), and "AND" corresponds to control signals applied to the logic 613 shown in FIG. 6. FIG. 7A also illustrates the waveform diagrams showing the signals (e.g., voltage signals) on the digit lines D and D_ corresponding to sense amp 654-2 and on the nodes S and S* corresponding to the compute component 665 (e.g., accumulator) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 6.

An example of pseudo code associated with loading (e.g., copying) a first data value stored in a cell coupled to row 662-X into the accumulator can be summarized as follows:

Copy Row X into the Accumulator:
    Deactivate EQ;
    Open Row X;
    Fire Sense Amps (after which Row X data resides in the sense amps);
    Activate LOAD (sense amplifier data (Row X) is transferred to nodes S1 and S2 of the Accumulator and resides there dynamically);
    Deactivate LOAD;
    Close Row X;
    Precharge;

In the pseudo code above, "Deactivate EQ" indicates that an equilibration signal (EQ signal shown in FIG. 7A) corresponding to the sense amplifier 654 is disabled at $t_1$ as shown in FIG. 7A (e.g., such that the complementary data lines (e.g., 653-1 DIGIT(n) and 653-2 (DIGIT(n)_ are no longer shorted to $V_{DD}$/2). After equilibration is disabled, a selected row (e.g., ROW X) is enabled (e.g., selected, opened such as by activating a signal to select a particular row) as indicated by "Open Row X" in the pseudo code and shown at $t_2$ for signal Row X in FIG. 7A. When the voltage signal applied to ROW X reaches the threshold voltage (Vt) of the access transistor corresponding to the selected cell, the access transistor turns on and couples the data line (e.g., 653-2 (DIGIT(n)_) to the selected cell (e.g., to capacitor 651) which creates a differential voltage signal between the data lines.

After Row X is enabled, in the pseudo code above, "Fire Sense Amps" indicates that the sense amplifier 654 is enabled to set the primary latch, as has been described herein, and subsequently disabled. For example, as shown at $t_3$ in FIG. 7A, the ACT positive control signal (e.g., 265 shown in FIG. 2B) goes high and the RnIF negative control signal goes low, which amplifies the differential signal between 653-1 (DIGIT(n)) and 653-2 (DIGIT(n)_), resulting in a voltage (e.g., $V_{DD}$) corresponding to a logic 1 or a voltage (e.g., GND) corresponding to a logic 0 being on data line 653-1 (DIGIT(n)). The voltage corresponding to the other logic is placed on the complementary data line 653-2 (DIGIT(n)_) The sensed data value is stored in the primary latch of sense amplifier 654. The primary energy consumption occurs in charging the data lines (e.g., 653-1 (DIGIT(n)) or 653-2 (DIGIT(n)_) from the equilibration voltage $V_{DD}/2$ to the rail voltage $V_{DD}$.

The four sets of possible sense amplifier and accumulator signals illustrated in FIG. 7A (e.g., one for each combination of Row X and Row Y data values) shows the behavior of signals on data lines D and D_ (e.g., 653-1 (DIGIT(n) or 653-2 (DIGIT(n)_). The Row X data value is stored in the primary latch of the sense amp. It should be noted that FIG. 7A shows that the memory cell including a storage element corresponding to Row X, is coupled to the complementary data line D_, while the memory cell including a different storage element corresponding to Row Y, is coupled to data line D. However, as can be seen in FIG. 7A, the charge stored in memory cell corresponding to Row X corresponding to a "0" data value causes the voltage on data line D_ to go high and the charge stored in a different memory cell corresponding to a "1" data value causes the voltage on data line D_ to go low, which is opposite correspondence between data states and charge stored in a memory cell corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 7A, causing load/pass transistors 655-1 and 655-2 to conduct. In this manner, activating the LOAD control signal enables the secondary latch in the accumulator of the compute component 665. The sensed data value stored in the sense amplifier 654 is transferred (e.g., copied) to the secondary latch. As shown for each of the four sets of possible sense amplifier and accumulator signals illustrated in FIG. 7A, the behavior at inputs of the secondary latch of the accumulator indicates the secondary latch is loaded with the Row X data value. As shown in FIG. 7A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 653-1 (DIGIT(n) or 653-2 (DIGIT(n)_in FIG. 6) in the pseudo code above, "Deactivate LOAD" indicates that the LOAD control signal goes back low as shown at $t_5$ in FIG. 7A to cause the load/pass transistors 655-1 and 655-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at $t_6$ in FIG. 7A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 7A by the EQ signal going high at $t_7$. As shown in each of the four sets of possible sense amplifier and accumulator signals illustrated in FIG. 7A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 654 and the secondary latch of the compute component 665 shown in FIG. 6) and the second data value (stored in a memory cell coupled to Row Y 662-Y) includes performing particular steps which depend on the whether an AND or an OR is to be performed. Examples of pseudo code associated with "ANDing" and "ORing" the data value residing in the accumulator (e.g., the first data value stored in the memory cell coupled to Row X 662-X) and the second data value (e.g., the data value stored in the memory cell coupled to Row Y 662-Y) are summarized below. Example pseudo code associated with "ANDing" the data values can include:

Deactivate EQ;
Open Row Y;
Fire Sense Amps (after which Row Y data resides in the sense amps);
Close Row Y;
  The result of the logic operation, in the next operation, will be placed on the sense amp, which will overwrite any row that is active.
  Even when Row Y is closed, the sense amplifier still contains the Row Y data value.
Activate AND;
  This results in the sense amplifier being written to the value of the function (e.g., Row X AND Row Y)
  If the accumulator contains a "0" (i.e., a voltage corresponding to a "0" on node S* and a voltage corresponding to a "1" on node S), the sense amplifier data is written to a "0";
  If the accumulator contains a "1" (i.e., a voltage corresponding to a "1" on node S* and a voltage corresponding to a "0" on node S), the sense amplifier data remains unchanged (Row Y data);
  This operation leaves the data in the accumulator unchanged.
Deactivate AND;
Precharge;

In the pseudo code above, "Deactivate EQ" indicates that an equilibration signal corresponding to the sense amplifier 654 is disabled (e.g., such that the complementary data lines 653-1 DIGIT(n) or 653-2 DIGIT(n)_ are no longer shorted to $V_{DD}/2$), which is illustrated in FIG. 7A at $t_8$. After equilibration is disabled, a selected row (e.g., ROW Y) is enabled as indicated in the pseudo code above by "Open Row Y" and shown in FIG. 7A at $t_9$. When the voltage signal applied to ROW Y reaches the threshold voltage (Vt) of the access transistor (e.g., 651-2) corresponding to the selected cell, the access transistor turns on and couples the data line (e.g., D_ 653-2) to the selected cell (e.g., to capacitor 652-2) which creates a differential voltage signal between the data lines.

After Row Y is enabled, in the pseudo code above, "Fire Sense Amps" indicates that the sense amplifier 654 is enabled to amplify the differential signal between 653-1 (DIGIT(n)) or 653-2 (DIGIT(n)_), resulting in a voltage (e.g., $V_{DD}$) corresponding to a logic 1 or a voltage (e.g., GND) corresponding to a logic 0 being on data line 653-1 (DIGIT(n)). The voltage corresponding to the other logic state is on complementary data line 653-2 (DIGIT(n)_). As shown at $t_{10}$ in FIG. 7A, the ACT positive control signal goes high and the RnIF negative control signal goes low to fire the sense amps. The sensed data value from a memory cell is stored in the primary latch of sense amplifier 654, as previously described. The secondary latch still corresponds to the data value from a memory cell since the dynamic latch is unchanged.

After the second data value sensed from the memory cell coupled to Row Y is stored in the primary latch of sense amplifier 206-2, in the pseudo code above, "Close Row Y" indicates that the selected row (e.g., ROW Y) can be disabled if it is not desired to store the result of the AND logical operation back in the memory cell corresponding to Row Y. However, FIG. 6A shows that Row Y is left enabled such that the result of the logical operation can be stored back in the memory cell corresponding to Row Y. Isolating the memory cell corresponding to Row Y can be accomplished by the access transistor turning off to decouple the selected cell from the data line 653-1 (DIGIT(n)).

After the selected Row Y is configured (e.g., to isolate the memory cell or not isolate the memory cell), "Activate AND" in the pseudo code above indicates that the AND control signal goes high as shown in FIG. 8A at $t_{11}$, causing pass transistor 655-1 to conduct. In this manner, activating the AND control signal causes the value of the function (e.g., Row X AND Row Y) to be written to the sense amp.

With the first data value (e.g., Row X) stored in the dynamic latch of the accumulator 665 and the second data value (e.g., Row Y) stored in the sense amplifier 654, if the dynamic latch of the compute component 665 contains a "0" (i.e., a voltage corresponding to a "0" on node S* and a voltage corresponding to a "1" on node S), the sense amplifier data is written to a "0" (regardless of the data value previously stored in the sense amp). This is because the voltage corresponding to a "1" on node S causes transistor 661-1 to conduct thereby coupling the sense amplifier 654 to ground through transistor 661-1, pass transistor 655-1 and data line 653-1 (D). When either data value of an AND operation is "0," the result is a "0." Here, when the second data value (in the dynamic latch) is a "0," the result of the AND operation is a "0" regardless of the state of the first data value. Thus the configuration of the sensing circuitry causes the "0" result to be written and initially stored in the sense amplifier 654. This operation leaves the data value in the accumulator unchanged (e.g., from Row X).

If the secondary latch of the accumulator contains a "1" (e.g., from Row X), then the result of the AND operation depends on the data value stored in the sense amplifier 654 (e.g., from Row Y). The result of the AND operation should be a "1" if the data value stored in the sense amplifier 654 (e.g., from Row Y) is also a "1," but the result of the AND operation should be a "0" if the data value stored in the sense amplifier 654 (e.g., from Row Y) is a "0." The sensing circuitry 650 is configured such that if the dynamic latch of the accumulator contains a "1" (i.e., a voltage corresponding to a "1" on node S* and a voltage corresponding to a "0" on node S), transistor 661-1 does not conduct, the sense amplifier is not coupled to ground (as described above), and the data value previously stored in the sense amplifier 654 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 654, "Deactivate AND" in the pseudo code above indicates that the AND control signal goes low as shown at $t_{12}$ in FIG. 7A, causing pass transistor 655-1 to stop conducting to isolate the sense amplifier 655 (and data line 653-1) from ground. If not previously done, Row Y can be closed (as shown at $t_{13}$ in FIG. 7A) and the sense amplifier can be disabled (as shown at $t_{14}$ in FIG. 7A by the ACT positive control signal going low and the RnIF negative control signal going high). With the data lines isolated, "Precharge" in the pseudo code above can cause a precharge of the data lines by an equilibrate operation, as described previously (e.g., commencing at $t_{14}$ shown in FIG. 7A).

FIG. 7A shows, in the alternative, the behavior of voltage signals on the data lines (e.g., 653-1 (DIGIT(n)) or 653-2 (DIGIT(n)_ shown in FIG. 6) coupled to the sense amplifier (e.g., 654 shown in FIG. 6) and the behavior of voltage signals on nodes S and S* of the secondary latch of the compute component (e.g., 665 shown in FIG. 6) for an AND logical operation involving each of the possible combination of operands (e.g., Row X/Row Y data values 00, 10, 01, and 11).

Although the timing diagrams illustrated in FIG. 7A and the pseudo code described above indicate initiating the AND logical operation after starting to load the second operand (e.g., Row Y data value) into the sense amplifier, the circuit shown in FIG. 6 can be successfully operated by initiating the AND logical operation before starting to load the second operand (e.g., Row Y data value) into the sense amplifier.

FIG. 7B illustrates a timing diagram associated with performing a number of logical operations using sensing circuitry in accordance with a number of embodiments of the present disclosure. FIG. 7B illustrates a timing diagram associated with initiating an OR logical operation after starting to load the second operand (e.g., Row Y data value) into the sense amplifier. FIG. 7B illustrates the sense amplifier and accumulator signals for various combinations of first and second operand data values. The particular timing diagram signals are discussed below with respect to the pseudo code associated with an AND logical operation of the circuit shown in FIG. 7A.

A subsequent operation phase can alternately be associated with performing the OR operation on the first data value (now stored in the sense amplifier 654 and the secondary latch of the compute component 665) and the second data value (stored in a memory cell coupled to Row Y 662-Y). The operations to load the Row X data into the sense amplifier and accumulator that were previously described with respect to times $t_1$-$t_7$ shown in FIG. 7A are not repeated with respect to FIG. 7B. Example pseudo code associated with "ORing" the data values can include:

Deactivate EQ;
Open Row Y;
Fire Sense Amps (after which Row Y data resides in the sense amps);
Close Row Y;
    When Row Y is closed, the sense amplifier still contains the Row Y data value.
Activate OR;
    This results in the sense amplifier being written to the value of the function (e.g., Row X OR Row Y), which may overwrite the data value from Row Y previously stored in the sense amplifier as follows:
    If the accumulator contains a "0" (i.e., a voltage corresponding to a "0" on node S* and a voltage corresponding to a "1" on node S), the sense amplifier data remains unchanged (Row Y data);
    If the accumulator contains a "1" (i.e., a voltage corresponding to a "1" on node S* and a voltage corresponding to a "0" on node S), the sense amplifier data is written to a "1";

This operation leaves the data in the accumulator unchanged.

Deactivate OR;

Precharge;

The "Deactivate EQ" (shown at $t_8$ in FIG. 7B), "Open Row Y" (shown at $t_9$ in FIG. 7B), "Fire Sense Amps" (shown at $t_{10}$ in FIG. 7B), and "Close Row Y" (shown at $t_{13}$ in FIG. 7B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 7B, which causes pass transistor 655-2 to conduct. In this manner, activating the OR control signal causes the value of the function (e.g., Row X OR Row Y) to be written to the sense amp.

With the first data value (e.g., Row X) stored in the secondary latch of the compute component 665 and the second data value (e.g., Row Y) stored in the sense amplifier 654, if the dynamic latch of the accumulator contains a "0" (i.e., a voltage corresponding to a "0" on node S* and a voltage corresponding to a "1" on node S), then the result of the OR operation depends on the data value stored in the sense amplifier 654 (e.g., from Row Y). The result of the OR operation should be a "1" if the data value stored in the sense amplifier 654 (e.g., from Row Y) is a "1," but the result of the OR operation should be a "0" if the data value stored in the sense amplifier 654 (e.g., from Row Y) is also a "0." The sensing circuitry 650 is configured such that if the dynamic latch of the accumulator contains a "0," with the voltage corresponding to a "0" on node S*, transistor 661-2 is off and does not conduct (and pass transistor 655-1 is also off since the AND control signal is not asserted) so the sense amplifier 654 is not coupled to ground (either side), and the data value previously stored in the sense amplifier 654 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S* and a voltage corresponding to a "0" on node S), transistor 661-2 does conduct (as does pass transistor 655-2 since the OR control signal is asserted), and the sense amplifier 654 input coupled to data line 205-2 (D_) is coupled to ground since the voltage corresponding to a "1" on node S2 causes transistor 661-2 to conduct along with pass transistor 655-2 (which also conducts since the OR control signal is asserted). In this manner, a "1" is initially stored in the sense amplifier 654 as a result of the OR operation when the secondary latch of the accumulator contains a "1" regardless of the data value previously stored in the sense amp. This operation leaves the data in the accumulator unchanged. FIG. 7B shows, in the alternative, the behavior of voltage signals on the data lines (e.g., 653-1 (DIGIT(n) or 653-2 (DIGIT(n)_ shown in FIG. 6) coupled to the sense amplifier (e.g., 654 shown in FIG. 6) and the behavior of voltage signals on nodes S and S* of the secondary latch of the compute component 665 for an OR logical operation involving each of the possible combination of operands (e.g., Row X/Row Y data values 00, 10, 01, and 11).

After the result of the OR operation is initially stored in the sense amplifier 654, "Deactivate OR" in the pseudo code above indicates that the OR control signal goes low as shown at $t_{12}$ in FIG. 6B, causing pass transistor 655-2 to stop conducting to isolate the sense amplifier 654 (and data line D 653-2) from ground. If not previously done, Row Y can be closed (as shown at $t_{13}$ in FIG. 7B) and the sense amplifier can be disabled by the ACT positive control signal going low and the RnIF negative control signal going high. With the data lines isolated, "Precharge" in the pseudo code above can cause a precharge of the data lines by an equilibrate operation, as described previously and shown at $t_{14}$ in FIG. 7B.

The sensing circuitry 650 illustrated in FIG. 6 can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORinv control signal can be asserted instead of the OR control signal. Activating the ORinv control signal causes transistor 656-2 to conduct and activating the ANDinv control signal causes transistor 656-1 to conduct. In each case, asserting the appropriate inverted control signal can flip the sense amplifier and cause the result initially stored in the sense amplifier 654 to be that of the AND operation using the inverted Row X and true Row Y data values or that of the OR operation using the inverted Row X and true Row Y data values. A true or complement version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 6 can perform a NOT (e.g., invert) operation by putting the non-inverted data value into the dynamic latch of the accumulator and using that data to invert the data value in the sense amplifier 654. As previously mentioned, activating the ORinv control signal causes transistor 656-2 to conduct and activating the ANDinv control signal causes transistor 656-1 to conduct. The ORinv and/or ANDinv control signals are used in implementing the NOT function, as described in the pseudocode below:

Copy Row X into the Accumulator;

Deactivate EQ;

Open Row X;

Fire Sense Amps (after which Row X data resides in the sense amps);

Activate LOAD (sense amplifier data (Row X) is transferred to nodes S1 and S2 of the Accumulator and resides there dynamically;

Deactivate LOAD;

Activate ANDinv and ORinv (which puts the complement data value on the data lines);

This results in the data value in the sense amplifier being inverted (e.g., the sense amplifier latch is flipped)

This operation leaves the data in the accumulator unchanged Deactivate ANDinv and ORinv;
    Close Row X;
    Precharge;

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above for the AND operation and OR operation. However, rather than closing the Row X and Precharging after the Row X data is loaded into the sense amplifier 654 and copied into the dynamic latch, a complement version of the data value in the dynamic latch of the accumulator can be placed on the data line and thus transferred to the sense amplifier 654. This is done by enabling (e.g., causing transistor to conduct) and disabling the invert transistors (e.g., ANDinv and ORinv). This results in the sense amplifier 654 being flipped from the true data value that was previously stored in the sense amplifier to a complement data value (e.g., inverted data value) being stored in the sense amp. As such, a true or complement version of the data value in the accumulator can be transferred to the sense amplifier based upon activating or not activating ANDinv and/or ORinv. This operation leaves the data in the accumulator unchanged.

Because the sensing circuitry 650 shown in FIG. 6 initially stores the result of the AND, OR, and/or NOT logical operations in the sense amplifier 654 (e.g., on the sense amplifier nodes), these logical operation results can be communicated easily and quickly to any enabled row, any row activated after the logical operation is complete, and/or into the secondary latch of the compute component 665. The sense amplifier 654 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 654 fires.

When performing logical operations in this manner, the sense amplifier 654 can be pre-seeded with a data value from the dynamic latch of the accumulator to reduce overall current utilized because the sense amps 654 are not at full rail voltages (e.g., supply voltage or ground/reference voltage) when accumulator function is copied to the sense amplifier 654. An operation sequence with a pre-seeded sense amplifier 654 either forces one of the data lines to the reference voltage (leaving the complementary data line at $V_{DD}/2$, or leaves the complementary data lines unchanged. The sense amplifier 654 pulls the respective data lines to full rails when the sense amplifier 654 fires. Using this sequence of operations will overwrite data in an enabled row.

FIG. 8 is a logic table illustrating selectable logic operation results implementable by the sensing circuitry shown in FIG. 6 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 654 and compute component 665. The four control signals, in conjunction with a particular data value present on the complementary sense lines, controls the continuity of the pass gates 655-1 and 655-2 and swap transistors, which in turn affects the data value in the compute component 665 and/or sense amplifier 654 before/after firing. The capability to selectably control continuity of the swap transistors facilitates implementing logical operations involving inverse data values (e.g., inverse operands and/or inverse result), among others.

The logic table illustrated in FIG. 8 shows the starting data value stored in the compute component 665 shown in column A at 844, and the starting data value stored in the sense amplifier 654 shown in column B at 845. The other 3 top column headings (NOT OPEN, OPEN TRUE, and OPEN INVERT) in the logic table of FIG. 8 refer to the continuity of the pass gates 655-1 and 655-2, and the swap transistors, which can respectively be controlled to be OPEN or CLOSED depending on the state of the four logic selection control signals (e.g., TF, TT, FT, and FF), in conjunction with a particular data value present on the pair of complementary sense lines 653-1 and 653-2 when the ISO control signal is asserted. The "Not Open" column 856 corresponds to the pass gates 655-1 and 655-2 and the swap transistors 742 both being in a non-conducting condition, the "Open True" 870 corresponds to the pass gates 655-1 and 655-2 being in a conducting condition, and the "Open Invert" 871 corresponds to the swap transistors being in a conducting condition. The configuration corresponding to the pass gates 655-1 and 655-2 and the swap transistors both being in a conducting condition is not reflected in the logic table of FIG. 8 since this results in the sense lines being shorted together.

Via selective control of the continuity of the pass gates 655-1 and 655-2 and the swap transistors, each of the three columns of the first set of two rows of the upper portion of the logic table of FIG. 8 can be combined with each of the three columns of the second set of two rows below the first set to provide 3×3=9 different result combinations, corresponding to nine different logical operations, as indicated by the various connecting paths shown at 875. The nine different selectable logical operations that can be implemented by the sensing circuitry 650 are summarized in the logic table illustrated in FIG. 8.

The columns of the lower portion of the logic table illustrated in FIG. 8 show a heading 880 that includes the state of logic selection control signals. For example, the state of a first logic selection control signal is provided in row 876, the state of a second logic selection control signal is provided in row 877, the state of a third logic selection control signal is provided in row 878, and the state of a fourth logic selection control signal is provided in row 879. The particular logical operation corresponding to the results is summarized in row 847.

As such, the sensing circuitry shown in FIG. 6 can be used to perform various logical operations as shown in FIG. 8. For example, the sensing circuitry 650 can be operated to perform various logical operations (e.g., AND and OR logical operations) in association with comparing data patterns in memory in accordance with a number of embodiments of the present disclosure.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. A potential advantage of the apparatuses and methods described herein may not be realized in terms of single instruction speed, but rather the cumulative speed that can be achieved by an entire bank of data being computed in parallel without necessarily transferring data out of the memory array (e.g., DRAM) or firing a column decode. For instance, data transfer time can be reduced or eliminated. As an example, apparatuses of the present disclosure can perform ANDs, ORs, or SHIFTs in parallel (e.g., concurrently), using data values in memory cells coupled to a data line (e.g., a column of 16K memory cells).

A signed division operation can be performed in parallel without transferring data out of the array via an I/O line. Further, previous approaches included sensing circuits where data is moved out for logical operation processing (e.g., using 32 or 64 bit registers) and included fewer operations being performed in parallel compared to the apparatus of the present disclosure. In this manner, significantly higher throughput is effectively provided along with more efficient use of avoiding transferring data out of the array by ensuring the data is stored in such a way to perform operations on the data in parallel. An apparatus and/or methods according to the present disclosure can also use less energy/area than configurations where the logical operation is discrete from the memory. Furthermore, an apparatus and/or methods of the present disclosure can provide additional energy/area advantages since the in-memory-array logical operations eliminate certain data value transfers.

Figure 9:
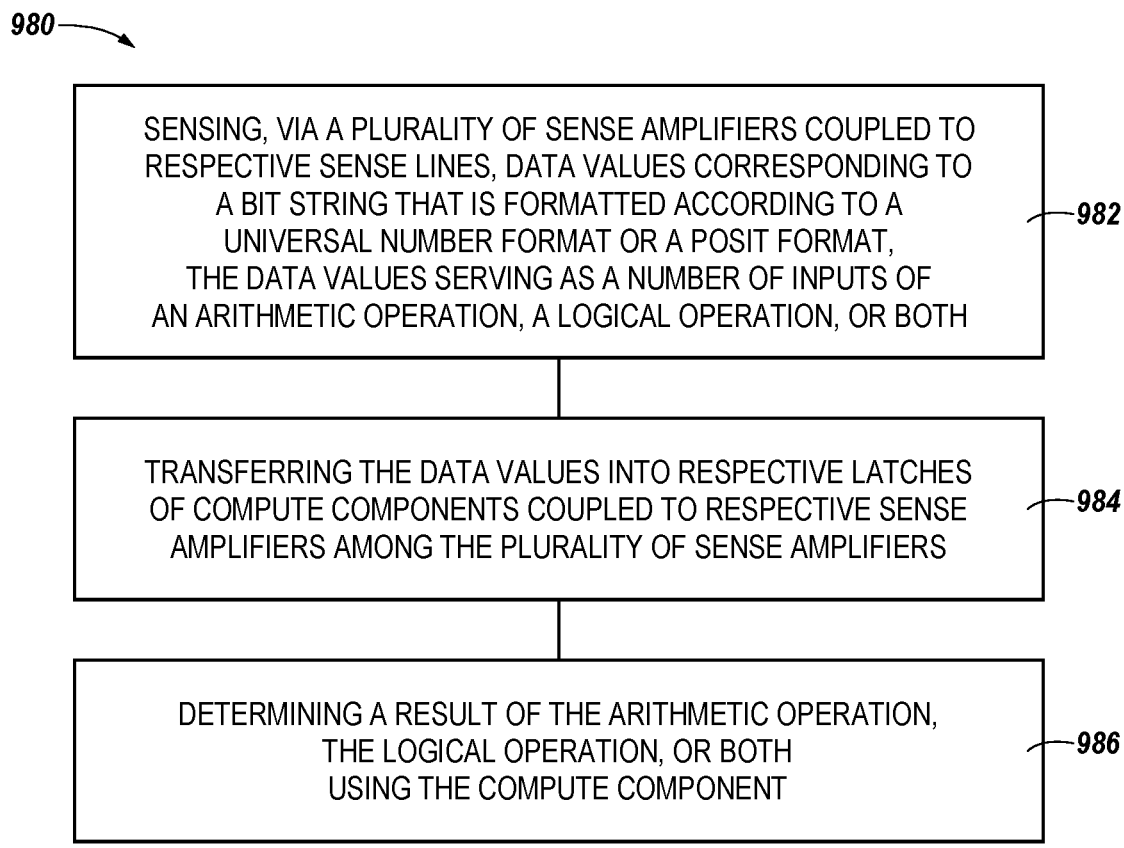
FIG. 9 is a flow diagram representing an example method for bit string operations in memory in accordance with a number of embodiments of the present disclosure.

FIG. 9 is a flow diagram representing an example method 980 for bit string operations in memory in accordance with a number of embodiments of the present disclosure. At block 982 the method 980 can include sensing, via a plurality of sense amplifiers coupled to respective sense lines, data values corresponding to a bit string that is formatted according to a universal number format or a posit format, the data values serving as a number of inputs of an arithmetic operation, a logical operation, or both. The sense amplifiers can be analogous to the sense amplifier 654 illustrated in FIG. 6, herein. The data values can correspond to bit strings that are formatted in a format different than an IEE 754 format or a floating-point format. For example, the data values can correspond to bit strings formatted according to unum (e.g., a Type III unum or posit) format).

At block 984, the method 980 can include transferring the data values into respective latches of compute components coupled to respective sense amplifiers among the plurality of sense amplifiers. The compute components can be analogous to the compute component 665 illustrated in FIG. 6, herein.

At block 986, the method can include determining a result of the arithmetic operation, the logical operation, or both using the compute component. In some embodiments, the method 980 can include determining the result of the arithmetic operation, the logical operation, or both without performing a sense line address access. For example, the compute component can be configured to perform operations to determine the result of the arithmetic operation, the logical operation, or both without enabling access lines to transfer data to or from circuitry external to a memory array in which the compute component is deployed. In some embodiments, the compute component can be configured to perform operations to determine the result of the arithmetic operation, the logical operation, or both prior to receiving an access command and/or an address for a sense line associated with the compute component or sense amplifiers.

The method 980 can further include comprising storing the result of the arithmetic operation, the logical operation, or both to an array of memory cells without activating input/output lines coupled to the plurality of sense amplifiers. For example, the method 980 can include storing the result of the arithmetic operation, the logical operation, or both in a memory array (e.g., the memory array 130/230 illustrated in FIGS. 1A-1B and 2A) without transferring the result of the arithmetic operation, the logical operation, or both to circuitry external to the memory array.

In some embodiments, the bit string can be used as a first operand in performing the arithmetic operation, the logical operation, and the method 980 can include determining that the bit string has a same quantity of bits or a same data type as a bit string that is used as a second operand in performing the arithmetic operation, the logical operation, or both, and performing the arithmetic operation, the logical operation, or both using the first operand and the second operand. For example, the method 980 can include determining that the bit string has a same bit string shape as a bit string used as a second operand in performing the arithmetic operation, the logical operation, or both, as described above.

The method 980 can further include storing the result of the arithmetic operation, the logical operation, or both in a plurality of storage locations that are in a periphery region of the plurality of sense amplifiers and the compute components, wherein the result of the arithmetic operation, the logical operation, or both is an exact result of the arithmetic operation, the logical operation, or both. For example, the method 980 can include storing exact (e.g., un-rounded) intermediate results of a recursive operation performed using the bit string(s) in a periphery location of the memory array while subsequent iterations of the recursive operation are performed.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. A method, comprising:
sensing, via a plurality of sense amplifiers coupled to respective sense lines, data values corresponding to a bit string that is formatted according to a universal number format or a posit format, the data values serving as a number of inputs of an arithmetic operation, a logical operation, or both;
transferring the data values into respective latches of compute components coupled to respective sense amplifiers among the plurality of sense amplifiers; and determining a result of the arithmetic operation, the logical operation, or both using the compute component.

2. The method of claim 1, further comprising determining the result of the arithmetic operation, the logical operation, or both before receiving an access command corresponding to a sense line address access.

3. The method of claim 1, further comprising performing, prior to sensing the data values, an operation to convert the bit string that is formatted according to the universal number format or the posit format from a format different than the universal number format or the posit format.

4. The method of claim 1, further comprising storing the result of the arithmetic operation, the logical operation, or both to an array of memory cells prior to activating input/output lines coupled to the plurality of sense amplifiers.

5. The method of claim 1, wherein the bit string is used as a first operand in performing the arithmetic operation, the logical operation, or both, and wherein the method further comprises:
determining that the bit string has a same quantity of bits as a bit string that is used as a second operand in performing the arithmetic operation, the logical operation, or both; and
performing the arithmetic operation, the logical operation, or both using the first operand and the second operand.

6. The method of claim 1, wherein the bit string is used as a first operand in performing the arithmetic operation, the logical operation, or both, and wherein the method further comprises:
determining that the bit string has a same data type as a bit string that is used as a second operand in performing the arithmetic operation, the logical operation, or both; and
performing the arithmetic operation, the logical operation, or both using the first operand and the second operand.

7. The method of claim 1, further comprising storing the result of the arithmetic operation, the logical operation, or both in a plurality of storage locations that are in a periphery region of the plurality of sense amplifiers and the compute components, wherein the result of the arithmetic operation, the logical operation, or both is an exact result of the arithmetic operation, the logical operation, or both.

8. An apparatus, comprising:
a plurality of sense amplifiers coupled to respective sense lines;
respective latches of compute components coupled to respective sense amplifiers among the plurality of sense amplifiers; and
a controller coupled to the plurality of sense amplifiers and the compute components, wherein the controller is configured to:
sense, via the plurality of sense amplifiers, data values corresponding to a bit string that is formatted according to a universal number format or a posit format, the data values serving as a number of inputs of an arithmetic operation, a logical operation, or both;
transfer the data values into the respective latches of the compute components; and
determine a result of the arithmetic operation, the logical operation, or both using the compute components.

9. The apparatus of claim 8, wherein the controller is configured to determine the result of the arithmetic operation, the logical operation, or both before receiving an access command corresponding to a sense line address access.

10. The apparatus of claim 8, wherein the controller is configured to perform, prior to sensing the data values, an operation to convert the bit string that is formatted according to the universal number format or the posit format from a format different than the universal number format or the posit format.

11. The apparatus of claim 8, wherein the controller is configured to store the result of the arithmetic operation, the logical operation, or both to an array of memory cells prior to activating input/output lines coupled to the plurality of sense amplifiers.

12. The apparatus of claim 8, wherein the bit string is used as a first operand in performing the arithmetic operation, the logical operation, or both, and wherein the controller is configured to:
determine that the bit string has a same quantity of bits as a bit string that is used as a second operand in performing the arithmetic operation, the logical operation, or both; and
perform the arithmetic operation, the logical operation, or both using the first operand and the second operand.

13. The apparatus of claim 8, wherein the bit string is used as a first operand in performing the arithmetic operation, the logical operation, or both, and wherein the controller is configured to:
determine that the bit string has a same data type as a bit string that is used as a second operand in performing the arithmetic operation, the logical operation, or both; and
perform the arithmetic operation, the logical operation, or both using the first operand and the second operand.

14. The apparatus of claim 8, wherein the controller is configured to store the result of the arithmetic operation, the logical operation, or both in a plurality of storage locations that are in a periphery region of the plurality of sense amplifiers and the compute components, wherein the result of the arithmetic operation, the logical operation, or both is an exact result of the arithmetic operation, the logical operation, or both.

15. A system, comprising:
a host; and
a memory device comprising:
a plurality of sense amplifiers coupled to respective sense lines;
respective latches of compute components coupled to respective sense amplifiers among the plurality of sense amplifiers; and
a controller coupled to the plurality of sense amplifiers and the compute components, wherein the controller is configured to:
sense, via the plurality of sense amplifiers, data values corresponding to a bit string that is formatted according to a universal number format or a posit format, the data values serving as a number of inputs of an arithmetic operation, a logical operation, or both;
transfer the data values into the respective latches of the compute components; and
determine a result of the arithmetic operation, the logical operation, or both using the compute components without transferring the result of the arithmetic operation, the logical operation, or both to the host.

16. The system of claim 15, wherein the controller is configured to determine the result of the arithmetic operation, the logical operation, or both before receiving an access command corresponding to a sense line address access.

17. The system of claim 15, wherein the controller is configured to store the result of the arithmetic operation, the logical operation, or both to an array of memory cells prior to activating input/output lines coupled to the plurality of sense amplifiers.

18. The system of claim 15, wherein the bit string is used as a first operand in performing the arithmetic operation, the logical operation, or both, and wherein the controller is configured to:
  determine that the bit string has a same quantity of bits as a bit string that is used as a second operand in performing the arithmetic operation, the logical operation, or both; and
  perform the arithmetic operation, the logical operation, or both using the first operand and the second operand.

19. The system of claim 15, wherein the bit string is used as a first operand in performing the arithmetic operation, the logical operation, or both, and wherein the controller is configured to:
  determine that the bit string has a same data type as a bit string that is used as a second operand in performing the arithmetic operation, the logical operation, or both; and
  perform the arithmetic operation, the logical operation, or both using the first operand and the second operand.

20. The system of claim 15, wherein the controller is configured to store the result of the arithmetic operation, the logical operation, or both in a plurality of storage locations that are in a periphery region of the plurality of sense amplifiers and the compute components, wherein the result of the arithmetic operation, the logical operation, or both is an exact result of the arithmetic operation, the logical operation, or both.

\* \* \* \* \*